(12) United States Patent
Vellianitis

(10) Patent No.: US 11,296,236 B2
(45) Date of Patent: Apr. 5, 2022

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventor: Georgios Vellianitis, Heverlee (BE)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 13 days.

(21) Appl. No.: 16/184,722

(22) Filed: Nov. 8, 2018

(65) Prior Publication Data

US 2020/0035840 A1 Jan. 30, 2020

Related U.S. Application Data

(60) Provisional application No. 62/712,201, filed on Jul. 30, 2018.

(51) Int. Cl.
| | |
|---|---|
| *H01L 29/786* | (2006.01) |
| *H01L 29/06* | (2006.01) |
| *H01L 29/423* | (2006.01) |
| *H01L 21/02* | (2006.01) |
| *H01L 29/66* | (2006.01) |

(Continued)

(52) U.S. Cl.
CPC .. *H01L 29/78696* (2013.01); *H01L 21/02236* (2013.01); *H01L 21/02532* (2013.01); *H01L 21/02603* (2013.01); *H01L 21/30604* (2013.01); *H01L 21/31111* (2013.01); *H01L 21/3247* (2013.01); *H01L 29/0673* (2013.01); *H01L 29/42392* (2013.01); *H01L 29/66545* (2013.01); *H01L 29/66742* (2013.01); *H01L 29/78618* (2013.01)

(58) Field of Classification Search
CPC ........... H01L 20/78696; H01L 29/0653; H01L 29/0673; H01L 29/775; H01L 29/045; H01L 29/42392; H01L 29/78618; H01L 29/66545; H01L 29/66439; H01L 29/66742; H01L 29/78696; H01L 21/02236; H01L 21/31111; H01L 21/02603; H01L 21/30604; H01L 21/31604; H01L 21/02532; H01L 21/3247
See application file for complete search history.

(56) References Cited

U.S. PATENT DOCUMENTS 9,209,247 B2 12/2015 Colinge et al.
9,236,267 B2 1/2016 De et al.
(Continued)

OTHER PUBLICATIONS

Lee et al. "Enhancement of High-Ns Electron Mobility in Sub-nm EOT Ge n-MOSFETs" 2013 Symposium on VLSI Technology Digest of Technical Papers, Jun. 11, 2013.

*Primary Examiner* — Vongsavanh Sengdara
(74) *Attorney, Agent, or Firm* — Birch, Stewart, Kolasch & Birch, LLP

(57) ABSTRACT

A semiconductor device includes a substrate, a plurality of nanowires, and a gate stack. The nanowires are over the substrate. Each of the nanowires includes a channel region, the channel region having top and bottom surfaces and a first sidewall between the top and bottom surfaces, in which the first sidewall of the channel region has a (111) crystalline orientation. The gate stack is over the channel regions of the nanowires.

20 Claims, 31 Drawing Sheets

(51) Int. Cl.
   *H01L 21/311*    (2006.01)
   *H01L 21/306*    (2006.01)
   *H01L 21/324*    (2006.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,853,114 B1* | 12/2017 | Rodder ............... H01L 29/0676 |
| 2007/0218635 A1* | 9/2007 | Seliskar ............. H01L 27/1203 |
| | | 438/268 |
| 2015/0228772 A1* | 8/2015 | Glass ................ H01L 29/7855 |
| | | 257/9 |
| 2015/0340457 A1* | 11/2015 | Xie .................... H01L 29/6681 |
| | | 257/288 |
| 2016/0204195 A1* | 7/2016 | Wen ................. H01L 29/66439 |
| | | 257/347 |
| 2016/0225849 A1* | 8/2016 | Wong .................... B82Y 40/00 |
| 2019/0198319 A1* | 6/2019 | Li ..................... H01L 21/02664 |

* cited by examiner

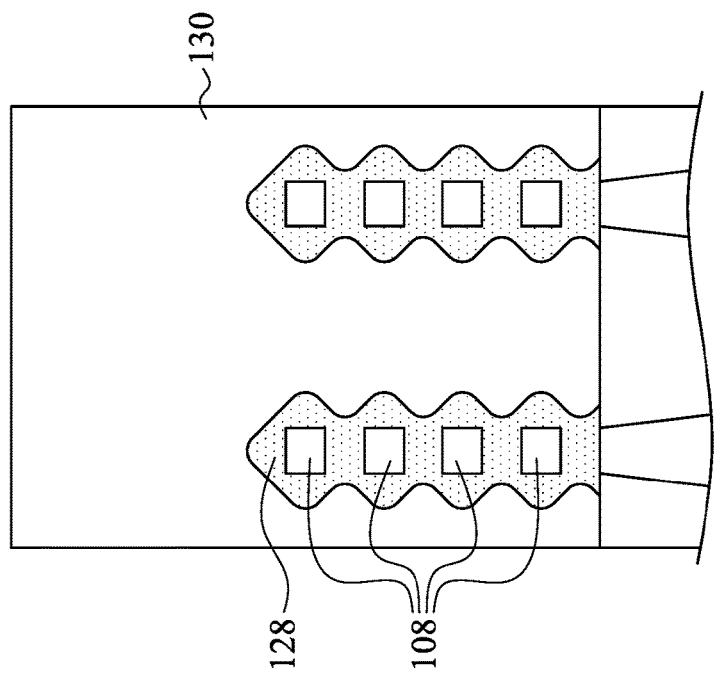
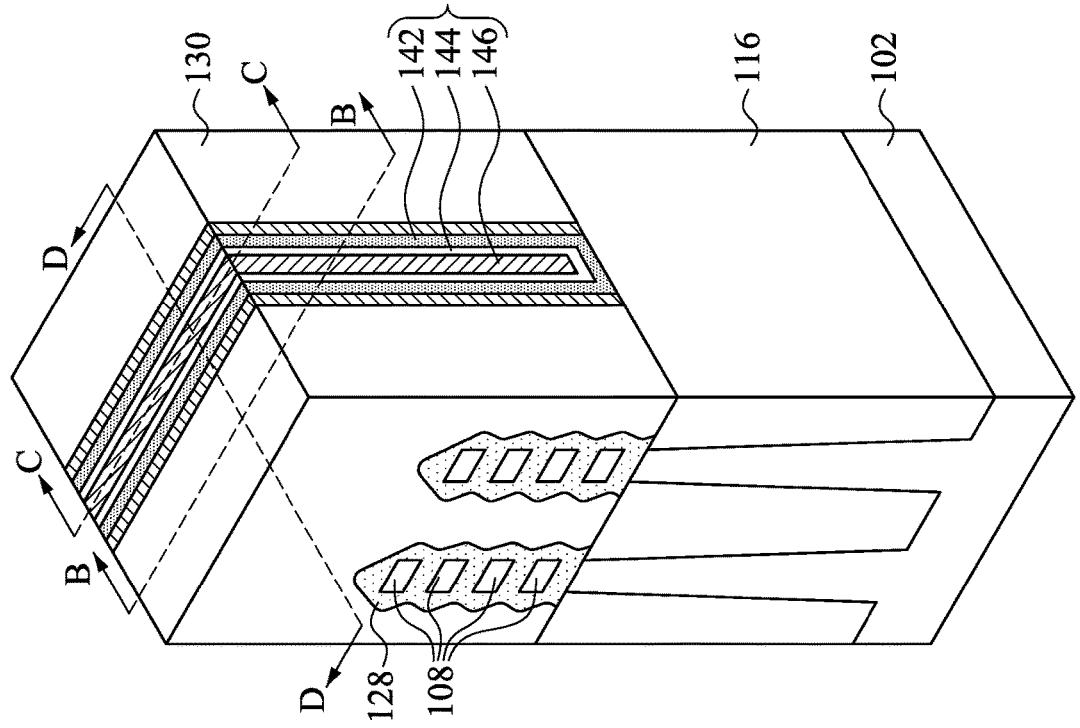
Fig. 14B
Fig. 14A

SEMICONDUCTOR DEVICE AND MANUFACTURING METHOD THEREOF

PRIORITY CLAIM AND CROSS-REFERENCE

This application claims priority to U.S. Provisional Application Ser. No. 62/712,201, filed Jul. 30, 2018, which is herein incorporated by reference.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far, these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
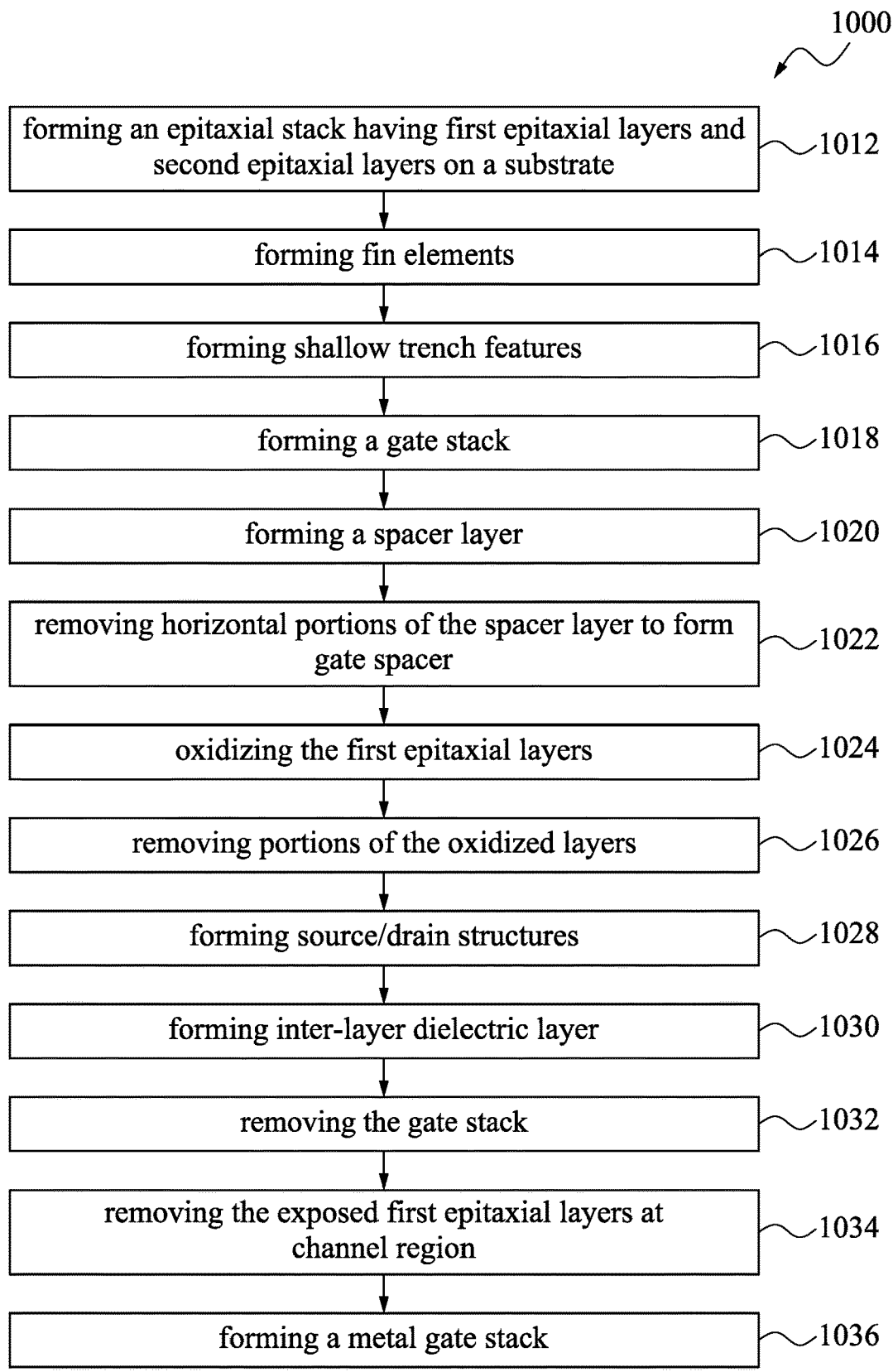
FIG. 1 is a method for manufacturing a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA transistor structures.

Illustrated in FIG. 1 is a method 1000 for manufacturing a semiconductor device in accordance with some embodiments of the present disclosure. As used herein, the term "multi-gate" is used to describe a device (e.g., a semiconductor transistor) that has at least some gate material disposed on multiple sides of at least one channel region of the device. In some examples, the multi-gate device may be referred to as a GAA device having gate material disposed on at least four sides of at least one channel region of the device. The channel region may be referred to as a "nanowire," which as used herein includes channel regions of various geometries (e.g., cylindrical, bar-shaped) and various dimensions.

FIGS. 2 to 14D illustrate a semiconductor device at various stages of manufacturing in accordance with some embodiments of the present disclosure. As with the other exemplary methods and exemplary devices discussed herein, it is understood that parts of the semiconductor device may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including p-type field effect transistors (PFETs), n-type field effect transistors (NFETs), etc., which may be interconnected. Moreover, it is noted that the process steps of method 10, including any descriptions given with reference to FIGS. 2 to 14D, as with the remainder of the method and exemplary figures provided in this disclosure, are merely exemplary and are not intended to be limiting.

Figure 2:
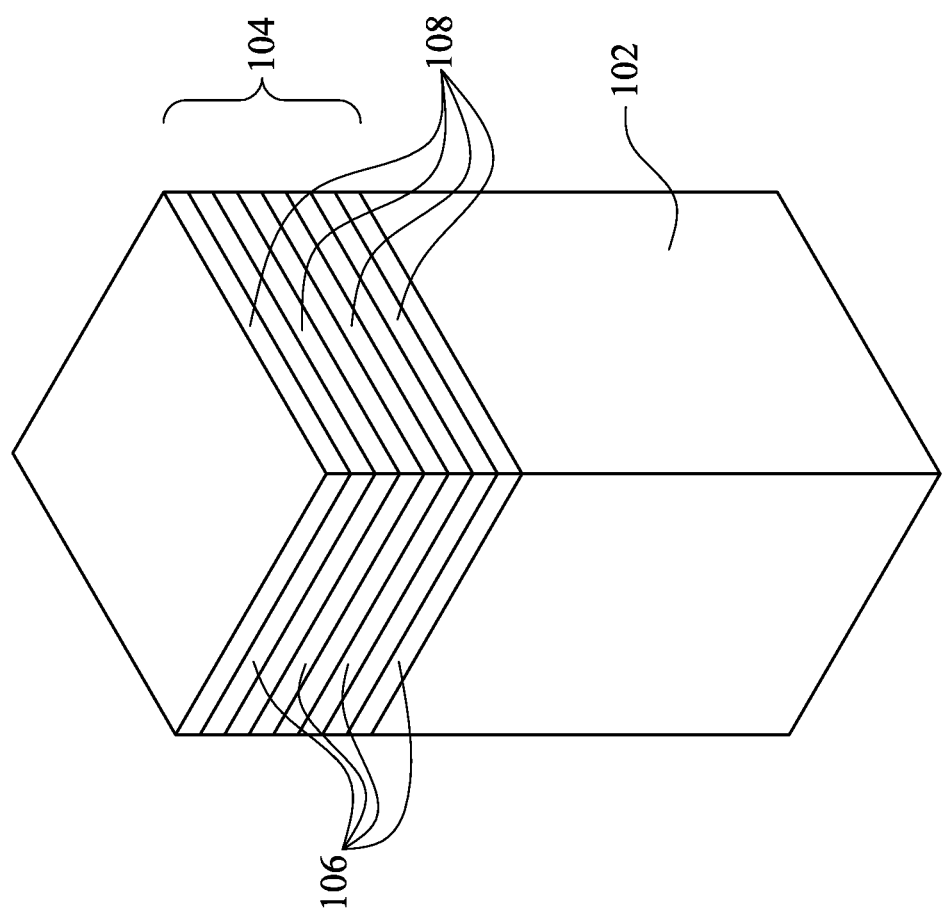
FIGS. 2 to 14D illustrate a semiconductor device at various stages of manufacturing in accordance with some embodiments of the present disclosure.

The method 1000 begins at operation 1012 where an epitaxial stack having first epitaxial layers and second epitaxial layers is formed over a substrate. With reference to FIG. 2, an epitaxial stack 104 is formed over the substrate 102. In some embodiments, the substrate 102 may be a semiconductor substrate such as a silicon substrate. In some embodiments, the substrate 102 may include various layers, including conductive or insulating layers formed on a semiconductor substrate. The suitable doping may include ion implantation of dopants and/or diffusion processes. In some embodiments, the substrate 102 may also include other semiconductors such as germanium, silicon carbide (SiC), silicon germanium (SiGe), or diamond. In some embodiments, the substrate 102 may include a compound semiconductor and/or an alloy semiconductor. In some embodiments, the substrate 102 may optionally include an epitaxial layer (epi-layer), may be strained for performance enhancement, may include a silicon-on-insulator (SOI) structure, and/or have other suitable enhancement features.

The epitaxial stack 104 includes first epitaxial layers 106 of a first composition interposed by second epitaxial layers 108 of a second composition different than the first composition. In some embodiments, the first epitaxial layers 106 are SiGe and the second epitaxial layers 108 are Si. In some embodiments, the first epitaxial layers 106 and the second epitaxial layers 108 have different oxidation rates and/or etch selectivity. For example, the first epitaxial layers 106 include SiGe and the second epitaxial layers 108 include Si, and the Si oxidation rate of the second epitaxial layers 108 is less than the SiGe oxidation rate of the first epitaxial layers 106. In some embodiments, the first epitaxial layers 106 are $Si_xGe_{1-x}$ and the second epitaxial layers 108 are $Si_yGe_{1-y}$, where y>x.

The second epitaxial layers 108 or portions thereof may form a channel region of a semiconductor device. In some embodiments, the second epitaxial layers 108 may be referred to as "nanowires" used to form a channel region of a semiconductor device such as a GAA transistor. These "nanowires" are also used to form portions of the source/drain features of the GAA transistor. The use of the second epitaxial layers 108 to define a channel or channels of the semiconductor device is further provided below.

It is noted that four layers of each of the first epitaxial layers 106 and the second epitaxial layers 108 are illustrated in FIG. 2, and this is for illustrative purpose and not intended to be limiting. It can be appreciated that any number of epitaxial layers can be formed in the epitaxial stack 104, depending on the desired number of channels regions for the GAA transistor. In some embodiments, the number of second epitaxial layers 108 is between two and ten.

In some embodiments, the first epitaxial layers 106 are substantially uniform in thickness. In some embodiments, the second epitaxial layers 108 are substantially uniform in thickness. As described in more detail below, the second epitaxial layers 108 may serve as one or more channel region(s) for a subsequently-formed GAA transistor and their thicknesses chosen based on device performance considerations. The first epitaxial layers 106 may serve to define at least one gap distance between adjacent channel regions for a subsequently-formed GAA device and their thicknesses chosen based on device performance considerations.

In some embodiments, epitaxial growth of the layers of the epitaxial stack 104 may be performed by a molecular beam epitaxy (MBE) process, a metalorganic chemical vapor deposition (MOCVD) process, and/or other suitable epitaxial growth processes. In some embodiments, the epitaxially grown layers (e.g., the first epitaxial layers 106 and the second epitaxial layers 108) include the same material as the substrate 102. In some embodiments, the epitaxially grown layers (e.g., the first epitaxial layers 106 and the second epitaxial layers 108) include a different material than the substrate 102. As stated above, in at least some examples, the first epitaxial layers 106 include at least one epitaxially grown silicon germanium (SiGe) layer and the second epitaxial layers 108 include at least one epitaxially grown silicon (Si) layer. In some embodiments, either of the first epitaxial layers 106 and the second epitaxial layers 108 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the first epitaxial layers 106 and the second epitaxial layers 108 may be chosen based on providing differing oxidation and/or different etch selectivity properties. In some embodiments, the first epitaxial layers 106 and the second epitaxial layers 108 are substantially dopant-free where, for example, no intentional doping is performed during the epitaxial growth process.

Figure 3:
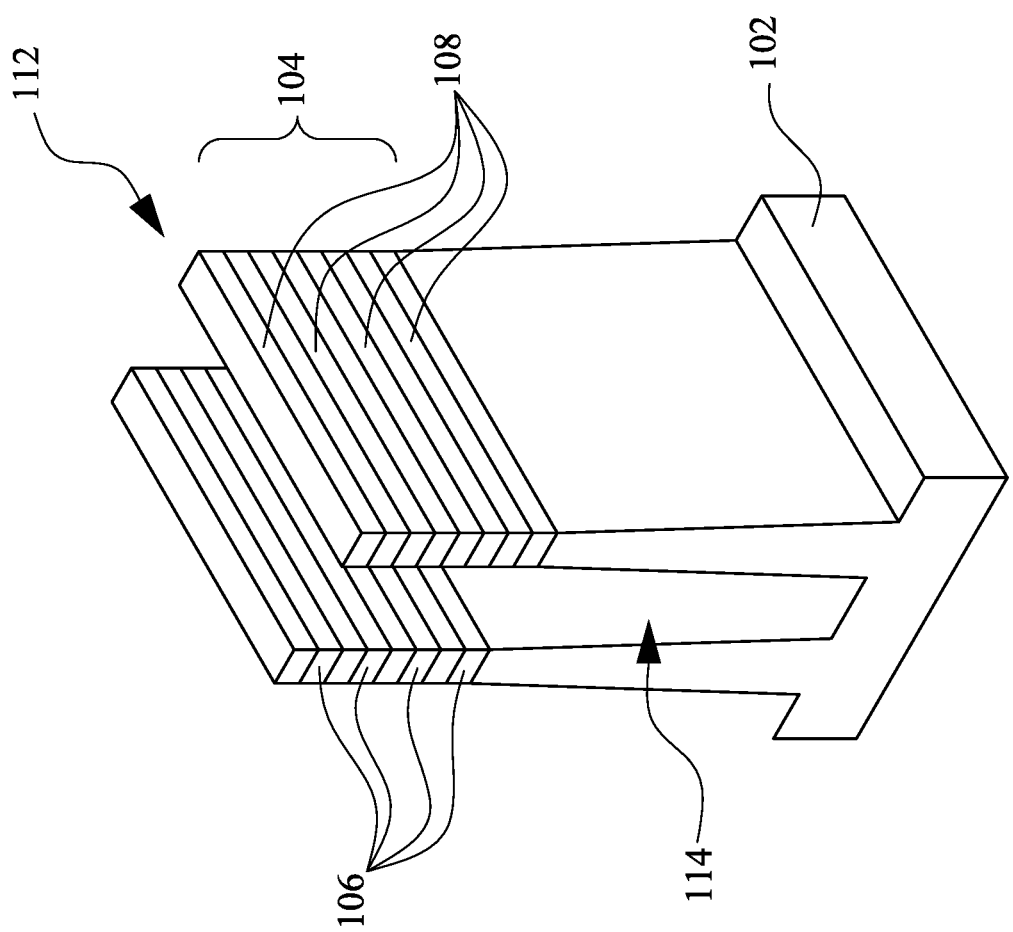

The method 1000 then proceeds to operation 1014 where fin elements are formed. With reference to FIG. 3, fin elements 112 extending from the substrate 102 are formed. In some embodiments, each of the fin elements 112 includes a substrate portion formed from the substrate 102, and portions of each of the epitaxial layers of the epitaxial stack 104 include the first epitaxial layers 106 and the second epitaxial layers 108.

In some embodiments, the fin elements 112 may be fabricated using suitable processes including photolithography and etch processes. The photolithography process may include forming a photoresist layer over the substrate 102 (e.g., over the epitaxial stack 104), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the epitaxial stack 104, while an etch process forms trenches 114 in unprotected regions through the masking element, thereby leaving the plurality of the extending fin elements 112. In some embodiments, the trenches 114 may be etched using a dry etch (e.g., reactive ion etching), a wet etch, and/or other suitable processes.

Figure 4:
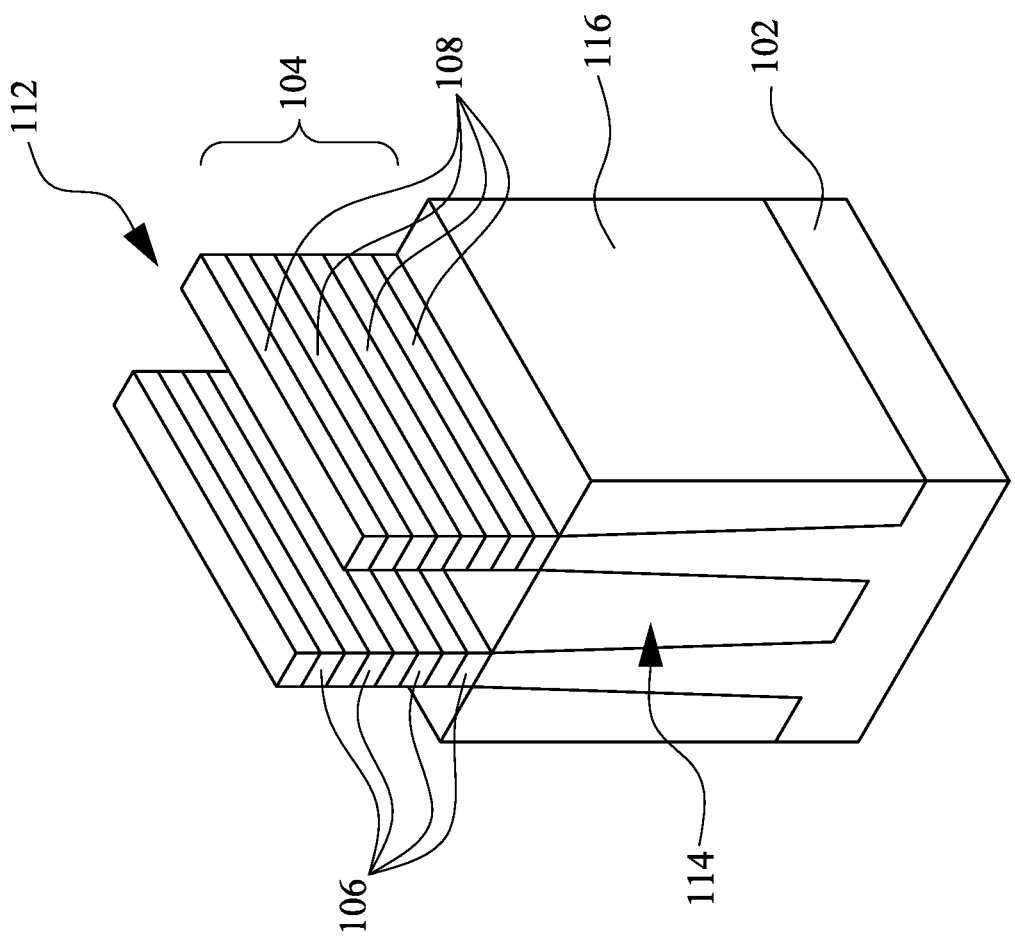

The method 1000 then proceeds to operation 1016 where shallow trench isolation (STI) features are formed between the fin elements 112. With reference to FIG. 4, the trenches 114 are filled with dielectric material to form isolation features 116. The isolation features 116 can be referred to as shallow trench isolation (STI) features interposing the fin elements 112. In some embodiments, the isolation features 116 may include $SiO_2$, $Si_3N_4$, $SiO_xN_y$, fluorine-doped silicate glass (FSG), a low-k dielectric, combinations thereof, and/or other suitable materials. In some embodiments, the isolation features 116 may be deposited by a chemical vapor deposition (CVD) process, a subatmospheric CVD (SACVD) process, a flowable CVD process, an atomic layer deposition (ALD) process, a physical vapor deposition (PVD) process, and/or other suitable process. In some embodiments, after deposition of the isolation features 116, an annealing process can be performed, for example, to improve the quality of the isolation features 116. In some embodiments, the isolation features 116 may include a multi-layer structure, for example, having one or more liner layers.

In some embodiments, after deposition of the isolation features 116, the deposited dielectric material is thinned and planarized by a chemical mechanical polishing (CMP) process. The CMP process may planarize top surfaces of the isolation features 116. In some embodiments, the STI features interposing the fin elements 112 are recessed, such that the fin elements 112 extend above the isolation features 116. In some embodiments, the recessing may include a dry etching process, a wet etching process, and/or a combination thereof. In some embodiments, a recessing depth is controlled (e.g., by controlling an etching time) so as to result in a desired height of the exposed upper portion of the fin elements 112, and the height exposes each of the layers of the epitaxial stack 104.

Numerous other embodiments of methods to form fin elements 112 over the substrate 102 may also be used including, for example, defining the fin region (e.g., by mask or isolation regions) and epitaxially growing the epitaxial stack 104 in the form of the fin elements 112. In some embodiments, forming the fin elements 112 may include a trim process to decrease the width of the fins, and the trim process may include a wet or dry etching process or a combination thereof.

Figure 5:
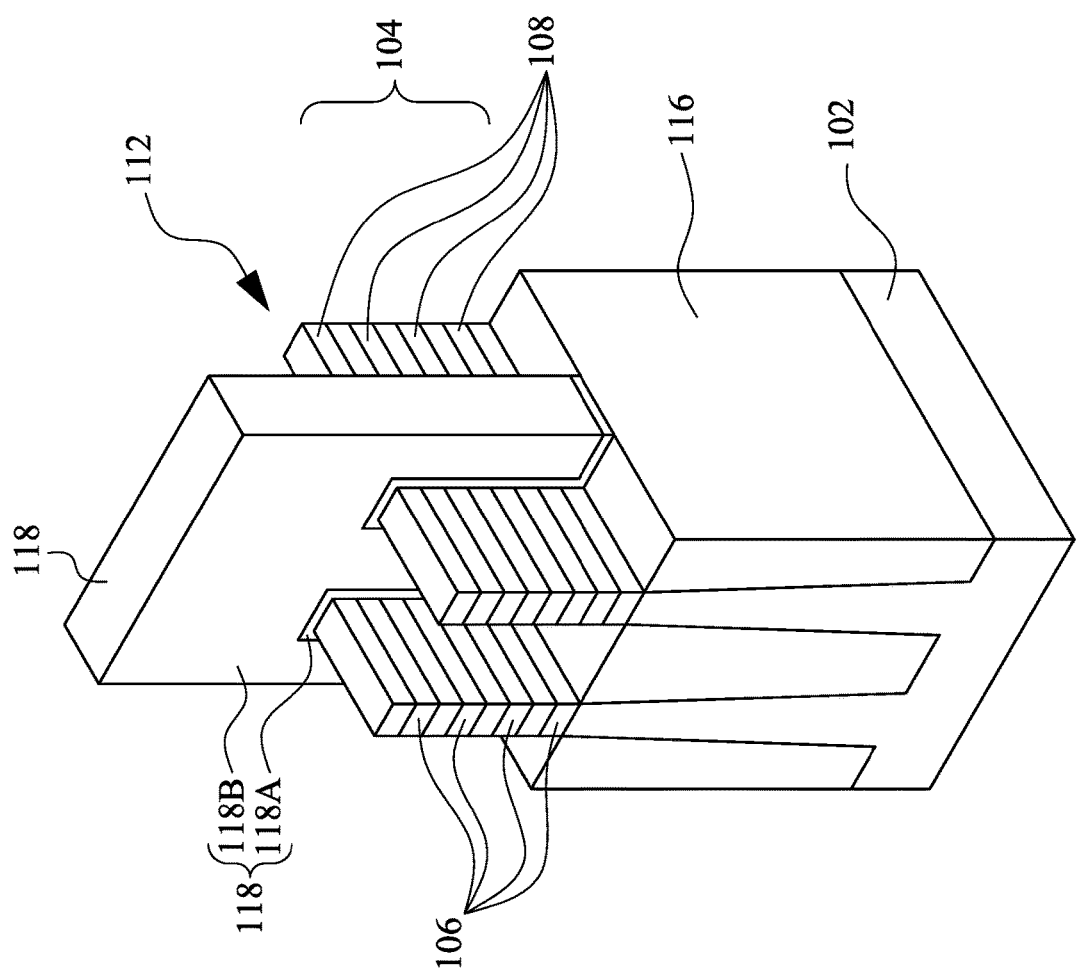

The method 1000 then proceeds to operation 1018 where a gate stack is formed. With reference to FIG. 5, a gate stack 118 is formed. In some embodiments, the gate stack 118 is a dummy gate stack. That is, in some embodiments using a gate-last process, the gate stack 118 is a dummy gate stack and will be replaced by a final gate stack at a subsequent step. In some embodiments, the gate stack 118 may be replaced at a later step by a high-k dielectric layer and a metal gate electrode. In some embodiments, the gate stack 118 is formed over the fin elements 112. Portions of the fin elements 112 underlying the gate stack 118 may be referred to as the channel regions or channels of GAA transistors. The gate stack 118 may also define source/drain regions of GAA transistors. In some embodiments, regions of the epitaxial stack 104 which are adjacent to the channel region and on opposite sides of the channel region may be referred to as the source/drain regions.

In some embodiments, the gate stack 118 includes one or more hard mask layers (e.g., oxide, nitride). In some embodiments, the gate stack 118 is formed by various process steps such as layer deposition, patterning, etching, as well as other suitable processing steps. Exemplary layer deposition processes includes CVD (including both low-pressure CVD and plasma-enhanced CVD), PVD, ALD, thermal oxidation, e-beam evaporation, or other suitable deposition techniques, or combinations thereof. In some embodiments, the patterning process for forming the gate stack 118 includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., reactive-ion etching (RIE) etching), wet etching, and/or other etching methods.

In some embodiments, the gate stack 118 may include a gate dielectric layer 118A and a gate electrode 118B. The gate dielectric layer 118A may include $SiO_2$, silicon nitride, a high-K dielectric material or other suitable material. In various examples, the gate dielectric layer 118A may be deposited by a CVD process, a SACVD process, a flowable CVD process, an ALD process, a PVD process, or other suitable process. By way of example, the gate dielectric layer 118A may be used to prevent damage to the fin elements 112 by subsequent processing (e.g., subsequent formation of the dummy gate stack). In some embodiments, the gate dielectric layer 118A may include silicon oxide. In some embodiments, the gate dielectric layer 118A of the gate stack 118 may include silicon nitride, a high-k dielectric material or other suitable material. In some embodiments, the gate electrode 118B of the gate stack 118 may include polycrystalline silicon (polysilicon). In some embodiments, hard mask layers (not shown) such as $SiO_2$, $Si_3N_4$, $SiO_xN_y$, alternatively include SiC, and/or other suitable compositions may also be included.

Figure 6:
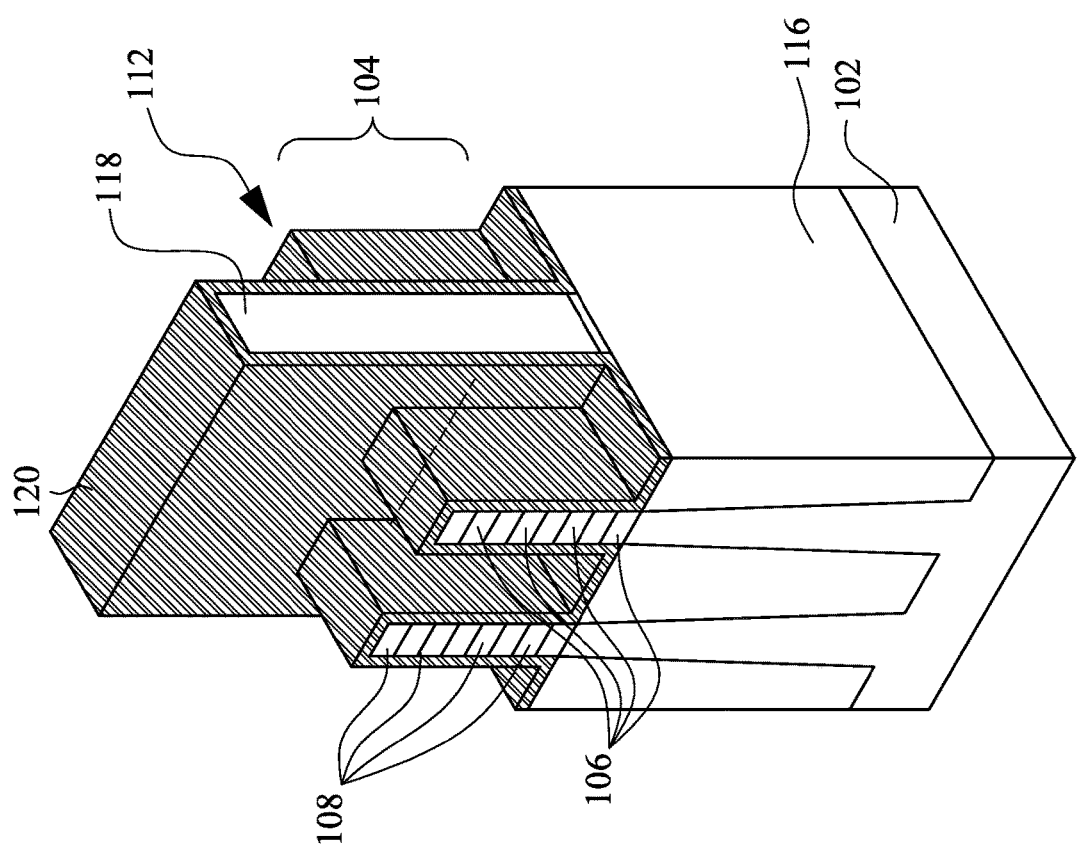

The method 1000 then proceeds to operation 1020 where a spacer layer is formed. With reference to FIG. 6, a spacer layer 120 is blanket formed over the substrate 102, the fin elements 112, and the gate stack 118. The spacer layer 120 may include a dielectric material such as $SiO_2$, $Si_3N_4$, $SiO_xN_y$, SiC, SiCN films, SiOc, SiOCN films, and/or combinations thereof. In some embodiments, the spacer layer 120 includes multiple layers, such as main spacer walls, liner layers, and the like. In some embodiments, the spacer layer 120 may be formed by depositing a dielectric material over the gate stack 118 using processes such as, CVD process, a SACVD process, a flowable CVD process, an ALD process, a PVD process, or other suitable process.

Figure 7:
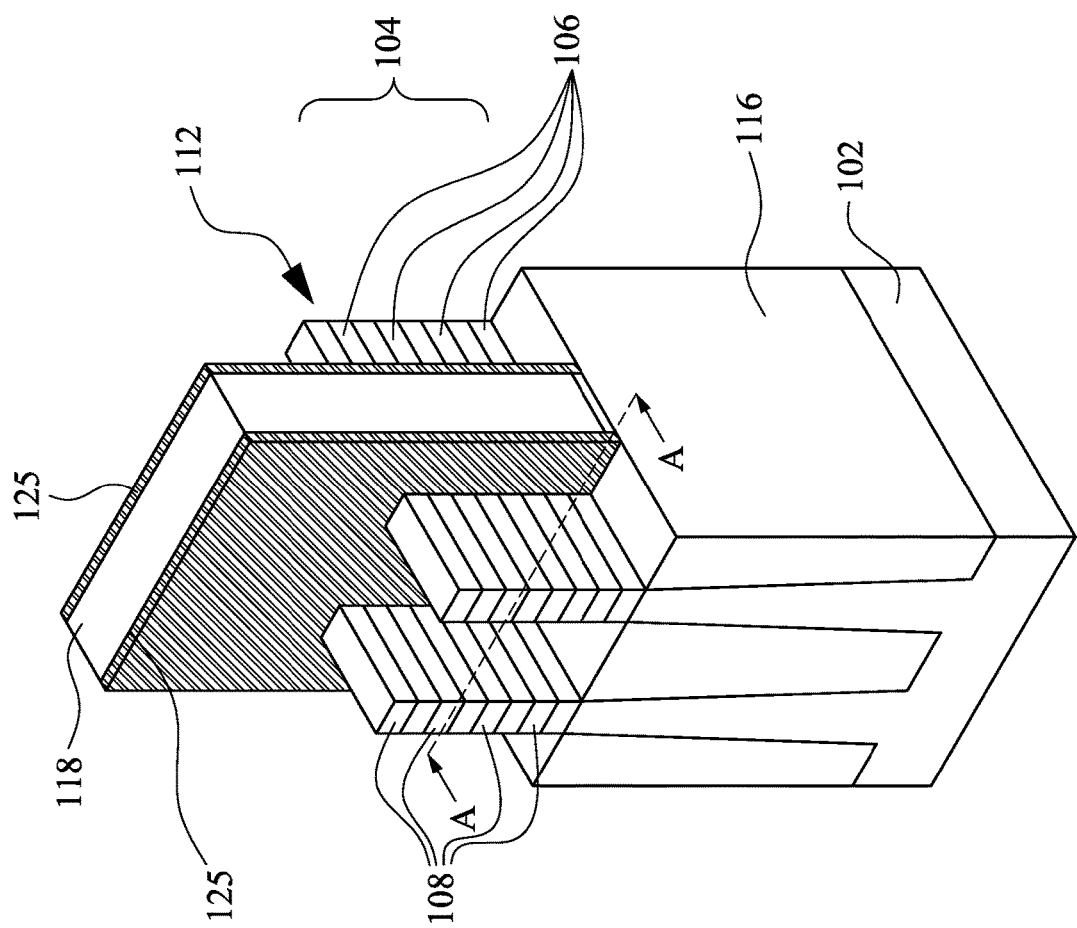

The method 1000 then proceeds to operation 1022 where portions of the spacer layer 120 are removed to form gate spacers. With reference to FIG. 7, an etching-back process is performed to remove some portions of the spacer layer 120, while other portions of the spacer layer 120 remain on sidewalls of the gate stack 118 to act as gate spacers 125. That is, after the formation of the spacer layer 120, the spacer layer 120 may be etched-back to expose portions of the fin elements 112 adjacent to and not covered by the gate stack 118 (e.g., source/drain regions), and spacers 125 remain on the opposite sidewalls of the gate stack 118. In some embodiments, the etching-back process of the spacer layer 120 may include a wet etch process, a dry etch process, a multiple-step etch process, and/or a combination thereof. The spacer layer 120 may be removed from a top surface of the exposed epitaxial stack 104 and lateral surfaces of the exposed epitaxial stack 104 and from a top surface of the gate stack 118. In some embodiments, the first epitaxial layers 106 and the second epitaxial layers 108 abut the sidewalls of the gate stack 118.

Figure 8:
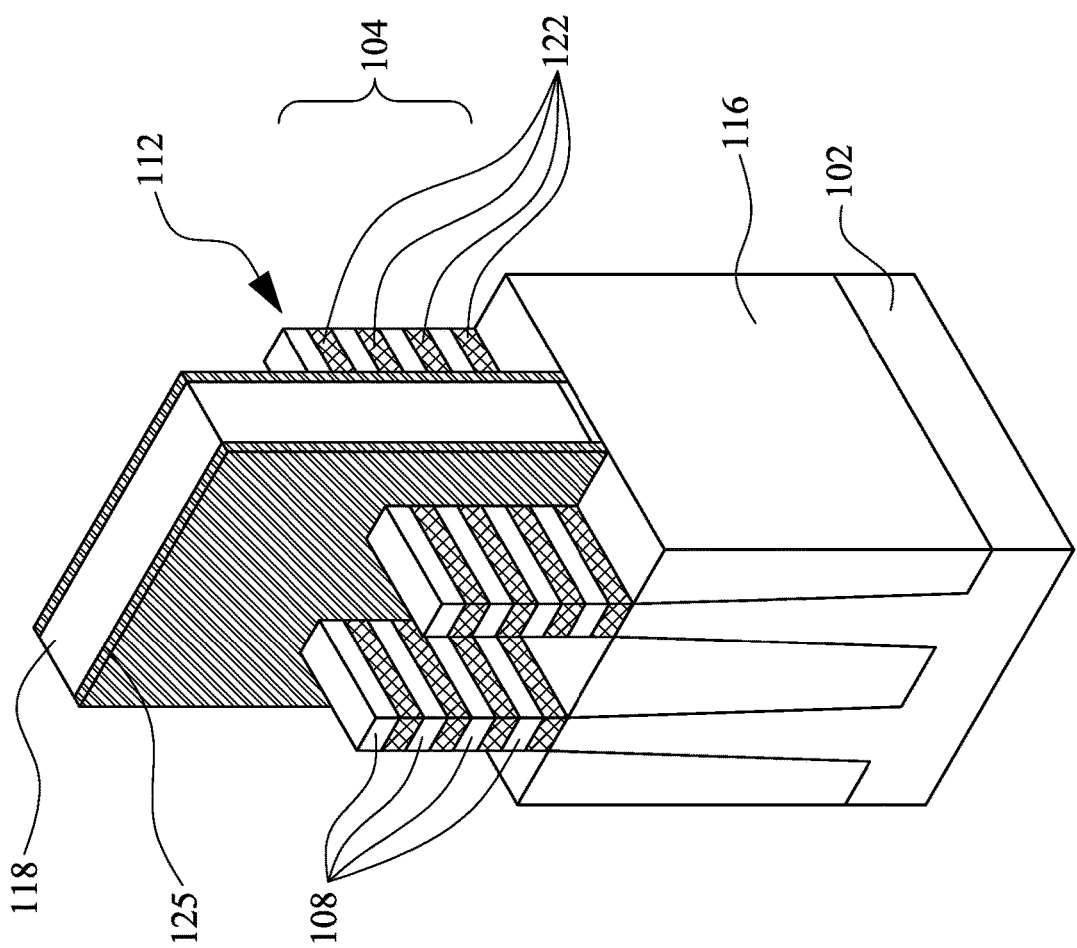

The method 1000 then proceeds to operation 1024 where the first epitaxial layers 106 are oxidized. With reference to FIG. 8, an oxidation process is performed. The oxidation process may be referred to as a selective oxidation due to the varying oxidation rates of the layers of the epitaxial stack 104, and thus certain layers are oxidized. In some embodiments, the oxidation process may be performed by exposing the semiconductor device to a wet oxidation process, a dry oxidation process, or a combination thereof. In some embodiments, the epitaxial stack 104 is exposed to a wet oxidation process using water vapor or steam as the oxidant, at a pressure of about 1 ATM, within a temperature range of about 400-600° C., and for a time from about 0.5-2 hours. It is noted that the oxidation process conditions provided herein are merely exemplary, and are not meant to be limiting. In some embodiments, the oxidation process may extend such that the oxidized portion of the epitaxial layer(s) of the epitaxial stack 104 abuts the sidewall of the gate stack 118.

During the oxidation process, the first epitaxial layers 106 of the fin elements 112 are substantially oxidized, and thus the first epitaxial layers 106 transform into an oxidized layers 122. The oxidized layers 122 extend to the gate stack 118, including, under the spacers 125. In some embodiments, the oxidized layers 122 extend to abut the sidewalls of the gate stack 118. In some embodiments, the oxidized layers 122 may include an oxide of silicon germanium ($SiGeO_x$).

By way of example, in some embodiments where the first epitaxial layers 106 include SiGe, and where the second epitaxial layers 108 includes Si, the faster SiGe oxidation rate (i.e., as compared to Si) ensures that the SiGe of the first epitaxial layers 106 become substantially oxidized while minimizing or eliminating the oxidization of the second epitaxial layers 108. It will be understood that any of the plurality of materials discussed above may be selected for each of the epitaxial layers that provide different suitable oxidation rates.

Figure 9:
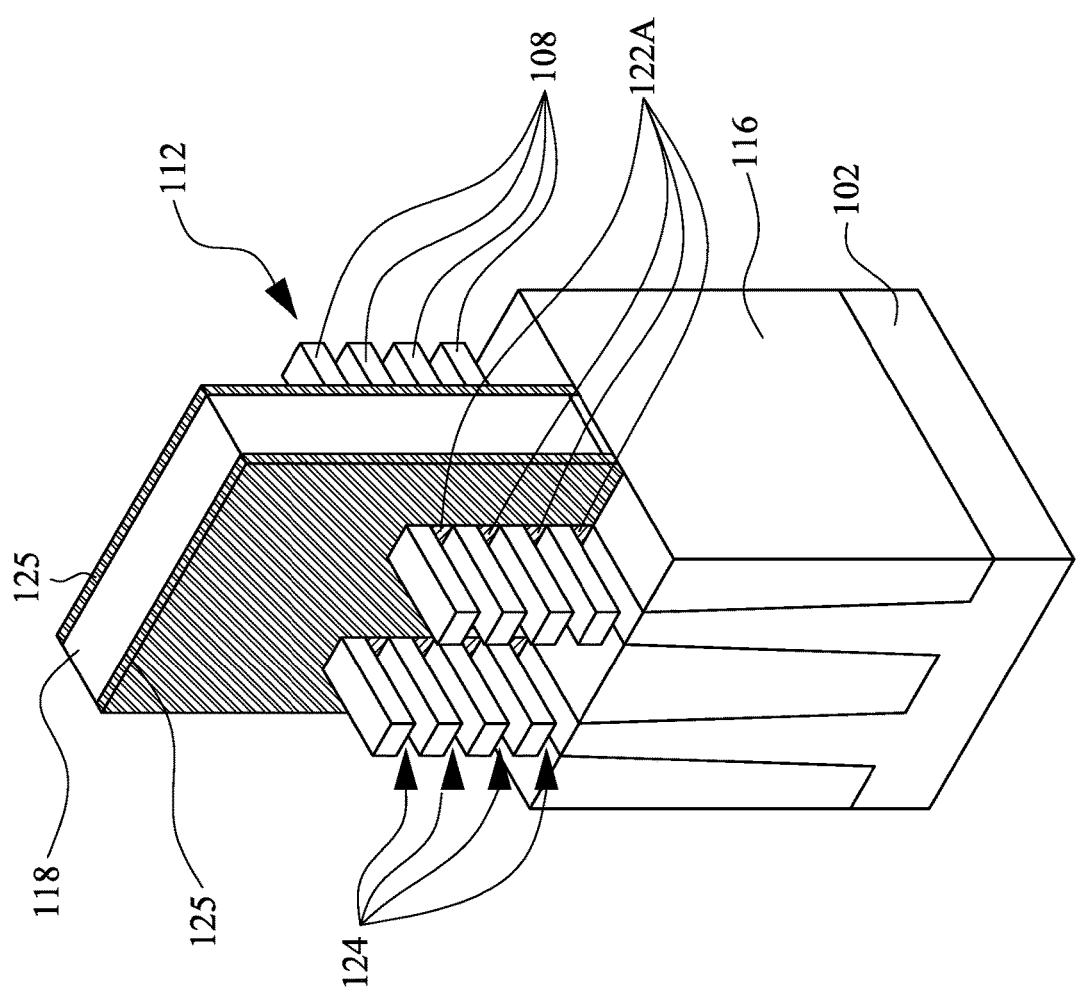

The method 1000 then proceeds to operation 1026 where portions of the oxidized layers 122 are removed. With reference to FIG. 9, a selective etching process is performed. In some embodiments, the selective etching may etch the oxidized layers 122 (see FIG. 8). In some embodiments, the oxidized layers 122 are removed from the source/drain regions (e.g., the regions of the fin elements 112 adjacent the channel regions underlying the gate stack 118). Portions of the oxidized layer 122 directly underlying the spacers 125 adjacent the gate stack 118 remain on the substrate 102 (e.g., during the etching process the spacers 125 act as masking elements). Removal of the oxidized layers 122 create gaps 124 in the places of removed portions of the oxidized layers 122, while portions 122A of the oxidized layer 122 (e.g., SiGeO) remain on the substrate 102. The gaps 124 may be filled with the ambient environment (e.g., air, $N_2$). In some embodiments, portions of the oxidized layers 122 are removed by a wet etching process, a dry etching process, or a combination thereof.

Figure 10:
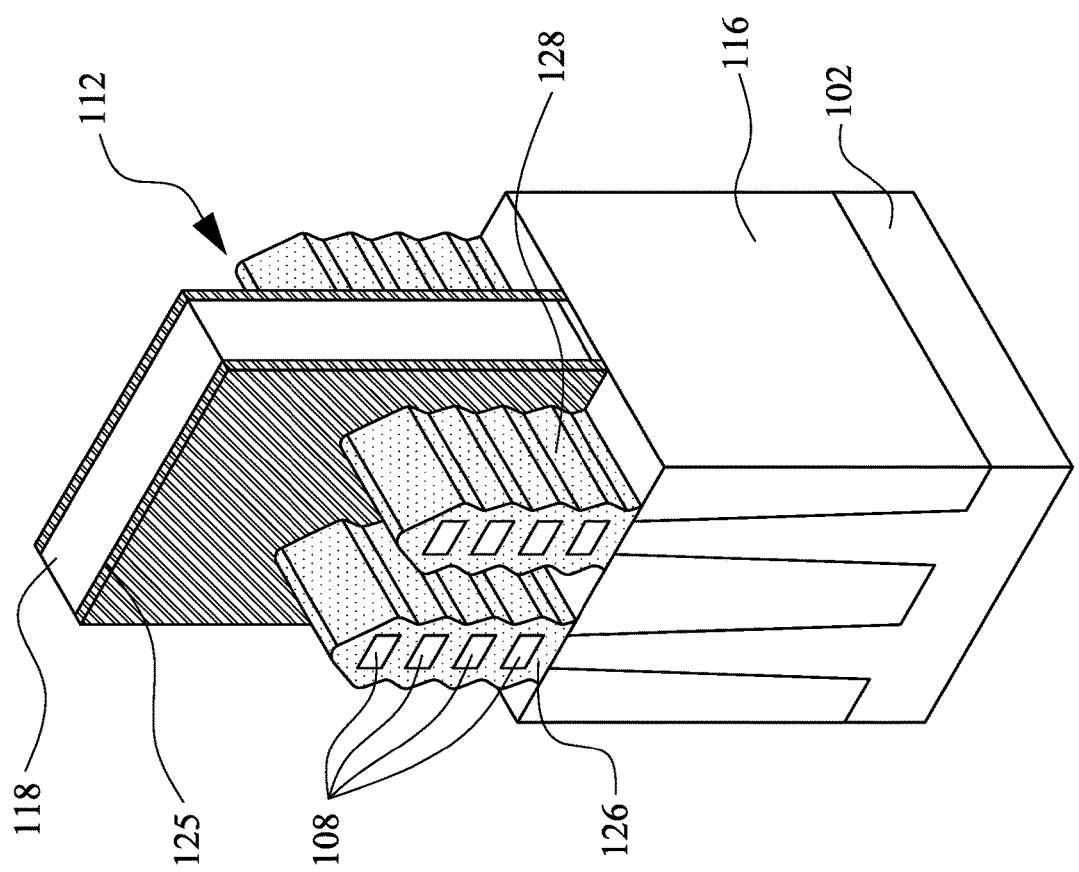

The method 1000 then proceeds to operation 1028 where source/drain structures are formed. With reference to FIG. 10, source/drain structures 128 are grown from the source/drain regions which are adjacent to the channel regions and on opposite sides of the channel regions. The source/drain structures 128 may be formed by performing an epitaxial growth process that provides an epitaxy material wrapping around the portions of the epitaxial layers 108 remaining in the source/drain regions of the fin elements 112.

In greater detail, the source/drain structures 128 are formed on the substrate 102 in/on the fin elements 112 adjacent to and associated with the gate stack 118. The source/drain structures 128 include material formed by epitaxially growing a semiconductor material on the exposed epitaxial layers 108. In other words, the epitaxial material is formed around the nanowire (e.g., epitaxial layers 108) adjacent the gate stack 118. This may also be referred to as forming a "cladding" around the nanowire. In some embodiments, the source/drain structures 128 may also be referred to as epitaxial structures.

In various embodiments, the source/drain structures 128 may include Ge, Si, GaAs, AlGaAs, SiGe, GaAsP, SiP, or other suitable material. In some embodiments, the source/drain structures 128 may be in-situ doped during the epitaxial growth process. For example, in some embodiments, epitaxially grown material may be doped with boron. In some embodiments, epitaxially grown material may be doped with carbon to form SiC source/drain features, phosphorous to form SiP source/drain features, or both carbon and phosphorous to form SiCP source/drain features. In some embodiments, the epitaxial layers 108 are silicon and the epitaxially grown material is also silicon. In some embodiments, the epitaxial layers 108 and the source/drain structures 128 may include a same material, but be differently doped. In other embodiments, the epitaxial layers 108 include a first semiconductor material, and the source/drain structures 128 include a second semiconductor different than the first semiconductor material. In some embodiments, the source/drain structures 128 are not in-situ doped. In such some embodiments, an implantation process is performed to dope the source/drain structures 128.

Figure 11:
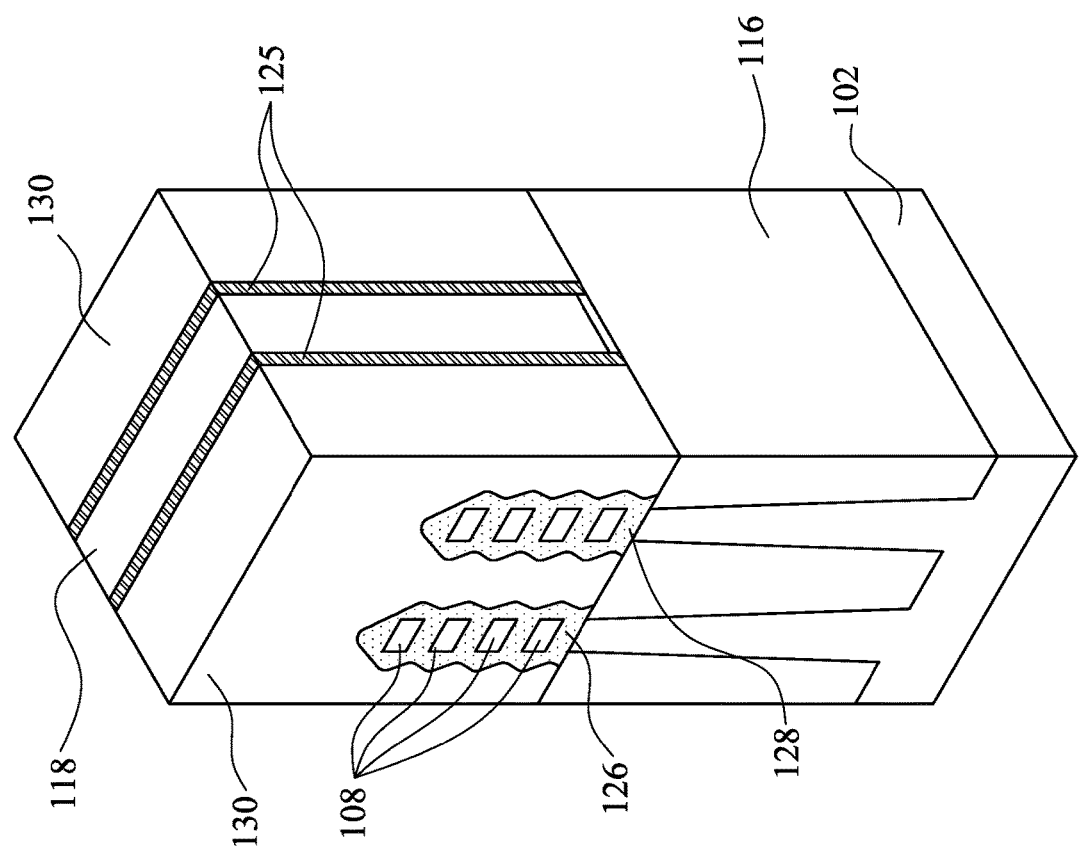

The method 1000 then proceeds to operation 1030 where an inter-layer dielectric (ILD) layer is formed. With reference to FIG. 11, an ILD layer 130 is formed over the substrate 102. In some embodiments, a contact etch stop layer (CESL) is also formed over the substrate 102 prior to forming the ILD layer 130. In some embodiments, the CESL includes a silicon nitride layer, silicon oxide layer, a silicon oxynitride layer, and/or other materials. The CESL may be formed by a plasma-enhanced chemical vapor deposition (PECVD) process and/or other suitable deposition process, or an oxidation process. Examples of materials for the ILD layer 130 include, but are not limited to, tetraethylorthosilicate (TEOS) oxide, un-doped silicate glass, and doped silicon oxide such as borophosphosilicate glass (BPSG), fused silica glass (FSG), phosphosilicate glass (PSG), boron doped silicon glass (BSG), and/or other suitable dielectric materials. The ILD layer 130 may be deposited by a PECVD process or other suitable deposition technique. In some embodiments, after depositing the ILD layer 130 (and/or CESL or other dielectric layers), a planarization process may be performed to expose the top surface of the gate stack 118. For example, a planarization process includes a CMP process which removes portions of the ILD layer 130 (and CESL layer, if present) overlying the gate stack 118.

Figure 12B:
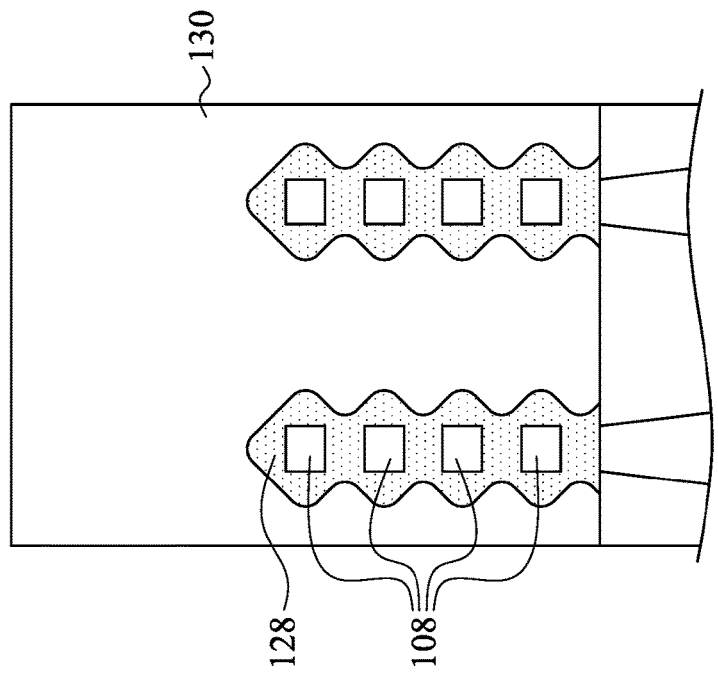
Figure 12A:
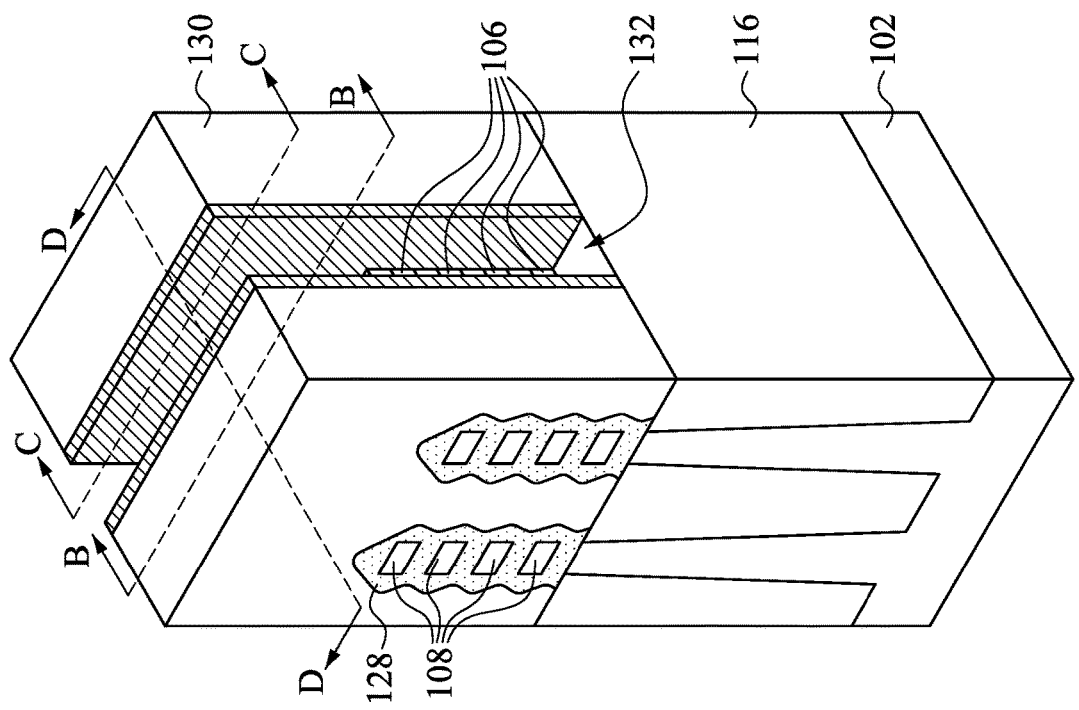
Figure 12D:
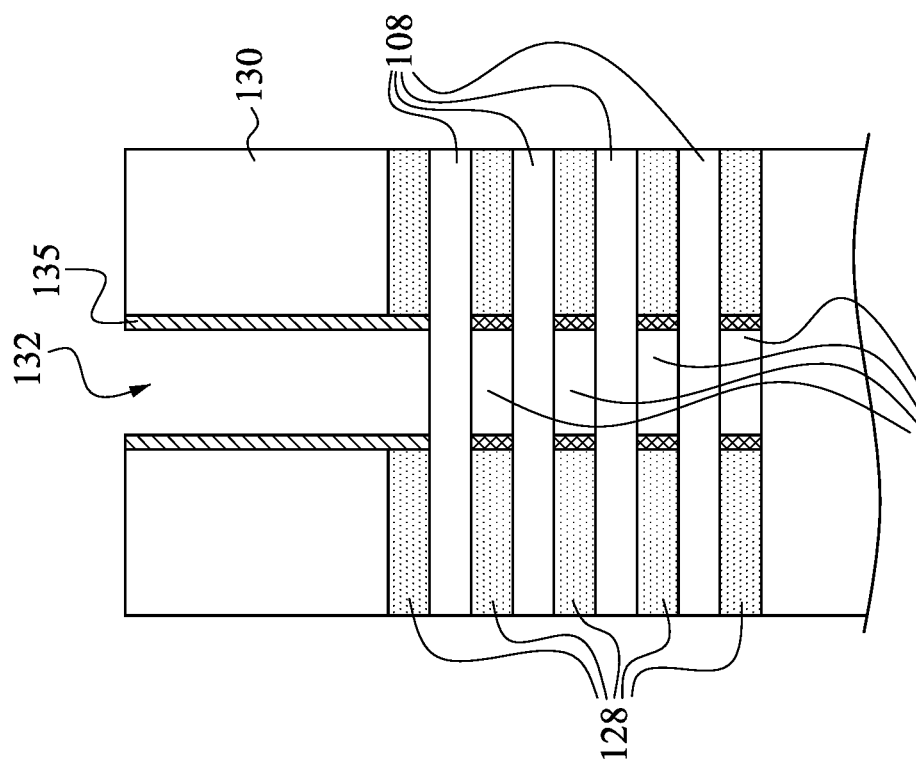
Figure 12C:
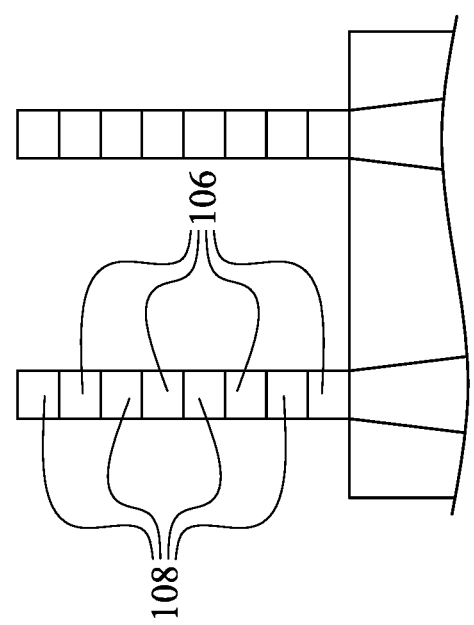

The method 1000 then proceeds to operation 1032 where the gate stack 118 is removed. With reference to FIG. 12A, a selective etching process is performed. The selective etching etches the gate stack 118 (see FIG. 11). FIGS. 12B, 12C, and 12D are cross-sectional views taken along lines B-B, C-C, and D-D in FIG. 12A, respectively. The etching of the gate stack 118 creates a gate trench 132 in the place of the removed gate stack 118. After the gate stack 118 is removed, the epitaxial layers 106 and 108 in the channel region are exposed by the gate stack 118. In some embodiments, the gate stack 118 is removed by a wet etching process, a dry etching process, or a combination thereof.

Figure 13B:
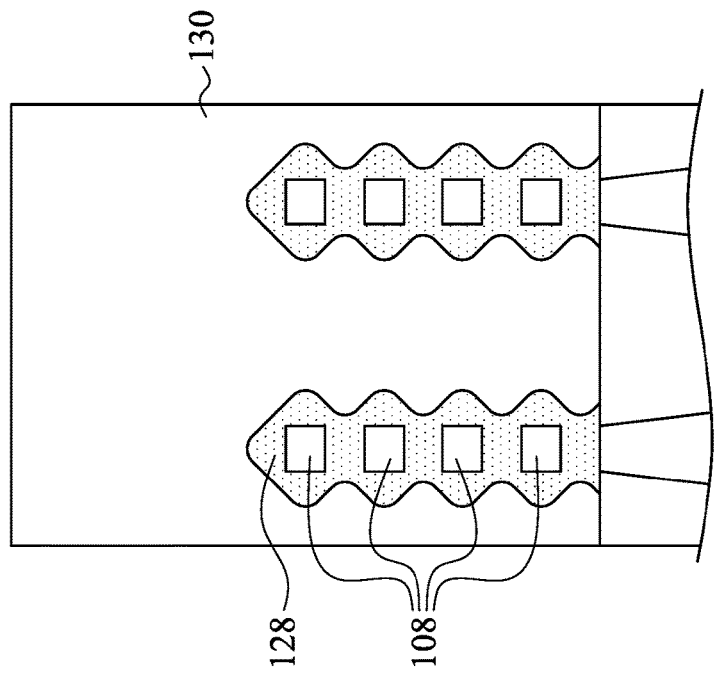
Figure 13A:
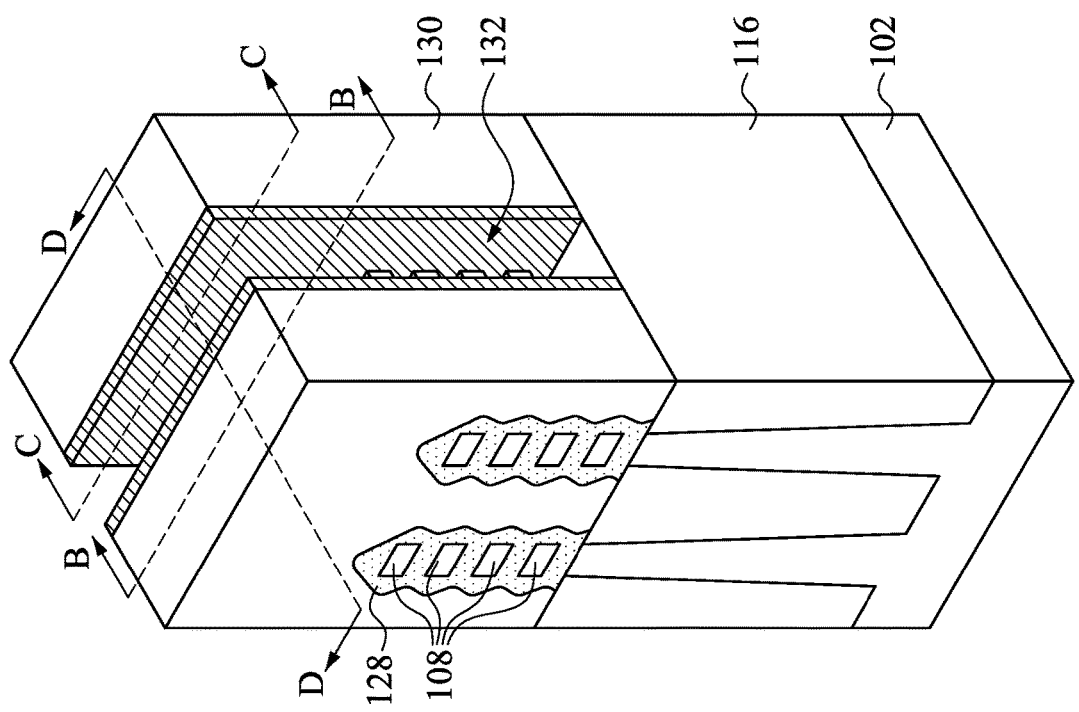
Figure 13D:
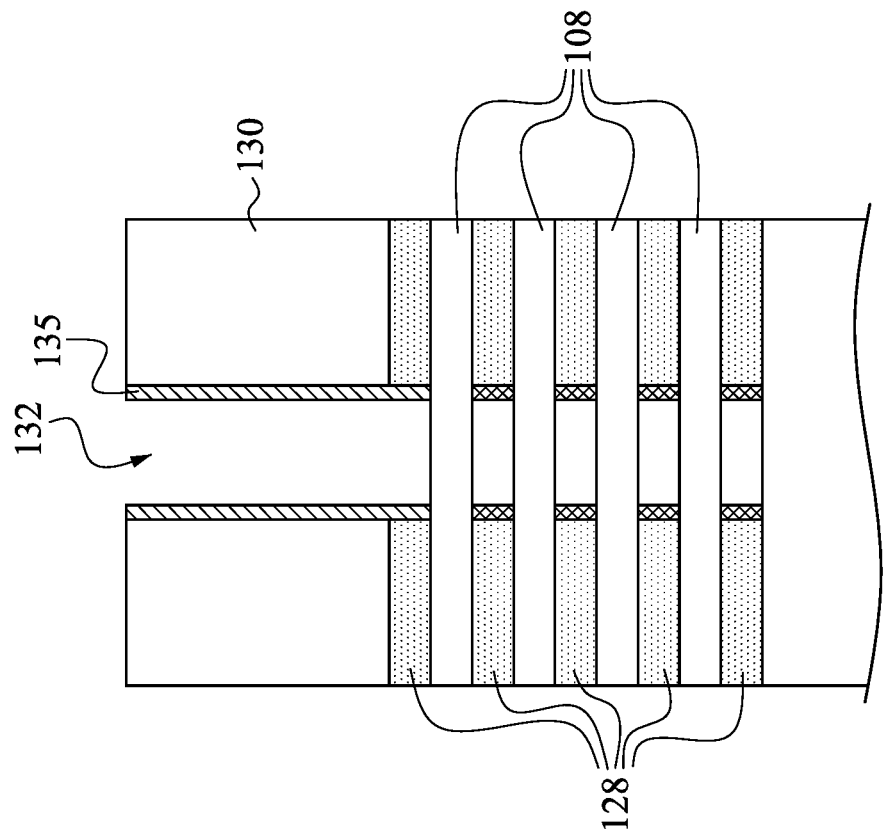
Figure 13C:
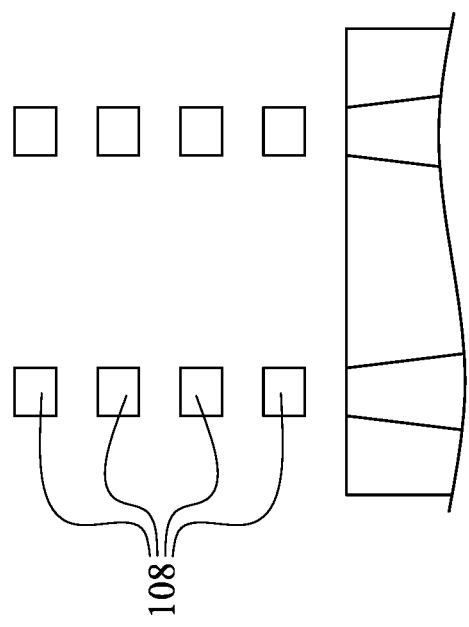

The method 1000 then proceeds to operation 1034 where the exposed first epitaxial layers 106 in the channel region are removed. With reference to FIG. 13A, a wet etching process is performed to remove the exposed first epitaxial layers 106 in the channel region. FIGS. 13B, 13C, and 13D are cross-sectional views taken along lines B-B, C-C, and D-D in FIG. 13A, respectively. In some embodiments, the wet etching may etch the exposed first epitaxial layers 106 in the channel region using an etchant that includes, e.g., hydrofluoric acid (HF). The first epitaxial layers 106 include a different material than the second epitaxial layers 108. In some embodiments, the first epitaxial layers 106 and the second epitaxial layers 108 have different etch selectivity. By way of example, in some embodiments where the first epitaxial layers 106 include SiGe and where the second epitaxial layers 108 include silicon), the faster SiGe etch rate (i.e., as compared to Si) ensures that the SiGe of the first epitaxial layers 106 are substantially removed while minimizing or eliminating the removal of the second epitaxial layers 108. It will be understood that any of the plurality of materials discussed above may be selected for each of the epitaxial layers that provide different suitable etch rates. Removal of the exposed first epitaxial layers 106 in the channel region create gaps in the places of the removed first epitaxial layers 106, i.e., between the second epitaxial layer 108 in the channel region.

Figure 14D:
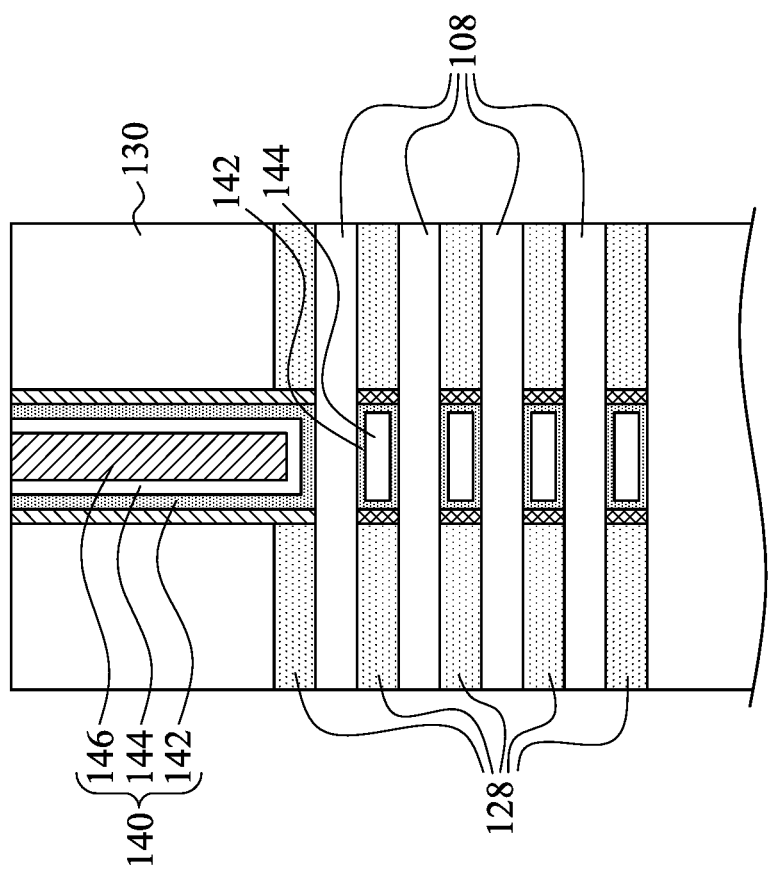
Figure 14C:
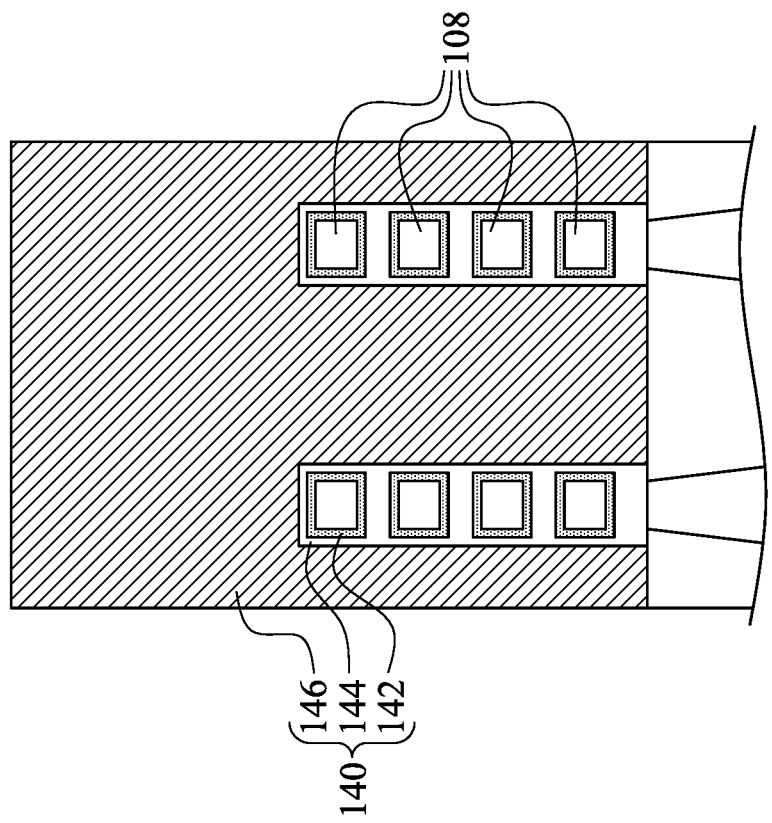

The method 1000 then proceeds to operation 1036 where a metal gate stack is formed. With reference to FIG. 14A, a metal gate stack 140 is formed in the gate trench 132 (see FIG. 12D). The metal gate stack 140 may be formed in the gaps between the second epitaxial layers 108 in the channel region (see FIG. 13D). FIGS. 14B, 14C, and 14D are cross-sectional views taken along lines B-B, C-C, and D-D in FIG. 14A, respectively. In some embodiments, the metal gate stack 140 includes a gate dielectric layer 142, a work function metal layer 144, and a gate electrode 146. The gate dielectric layer 142 includes a dielectric material having a high dielectric constant, for example, greater than that of silicon oxide (~3.9).

Exemplary gate dielectric layer 142 materials include, but are not limited to, $HfO_2$, $TiO_2$, $HfZrO$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectric layer 142 may be deposited by an ALD process, a PVD process, a CVD process, an oxidation process, and/or other suitable process.

The work function metal layer 144 and the gate electrode 146 may include metal, metal alloy, and/or metal silicide. In some embodiments, the work function metal layer 144 may include a single layer structure or, in other embodiments, a multi-layer structure to enhance the device performance. The work function metal layer 144 may also include liner layer, wetting layer, adhesion layer and a conductive layer of metal, metal alloy or metal silicide. For example, the work function metal layer 144 may be an n-type or a p-type work function metal layer. Exemplary p-type work function metal layer 144 materials include, but are not limited to, TiN, TaN, Ru, Mo, Al, WN, $ZrSi_2$, $MoSi_2$, $TaSi_2$, $NiSi_2$, WN, other suitable p-type work function metal layer 144 materials, and combinations thereof. Exemplary n-type work function metal layer 144 materials include, but are not limited to, Ti, Ag, TaAl, TaAlC, TiAlN, TaC, TaCN, TaSiN, Mn, Zr, other suitable n-type work function metal layer 144 materials, and combinations thereof. The work function metal layer 144 may be deposited by a CVD process, a PVD process, an electro-plating process, and/or other suitable process.

Exemplary gate electrode 146 materials include, but are not limited to, tungsten (W), cobalt (Co), ruthenium (Ru), aluminum (Al), the like, or combinations thereof. The gate electrode 146 may deposited by an molecular beam deposition (MBD) process, an ALD process, a PECVD process, and the like.

In some embodiments, an interfacial layer is between the gate dielectric layer 142 and the second epitaxial layers 108. Exemplary interfacial layer materials include, but are not limited to, $SiO_2$, HfSiO, SiON, other dielectric material, and the like. The interfacial layer may be formed by a chemical oxidation process, a thermal oxidation process, an ALD process, a CVD process, and/or other suitable process.

Figure 15:
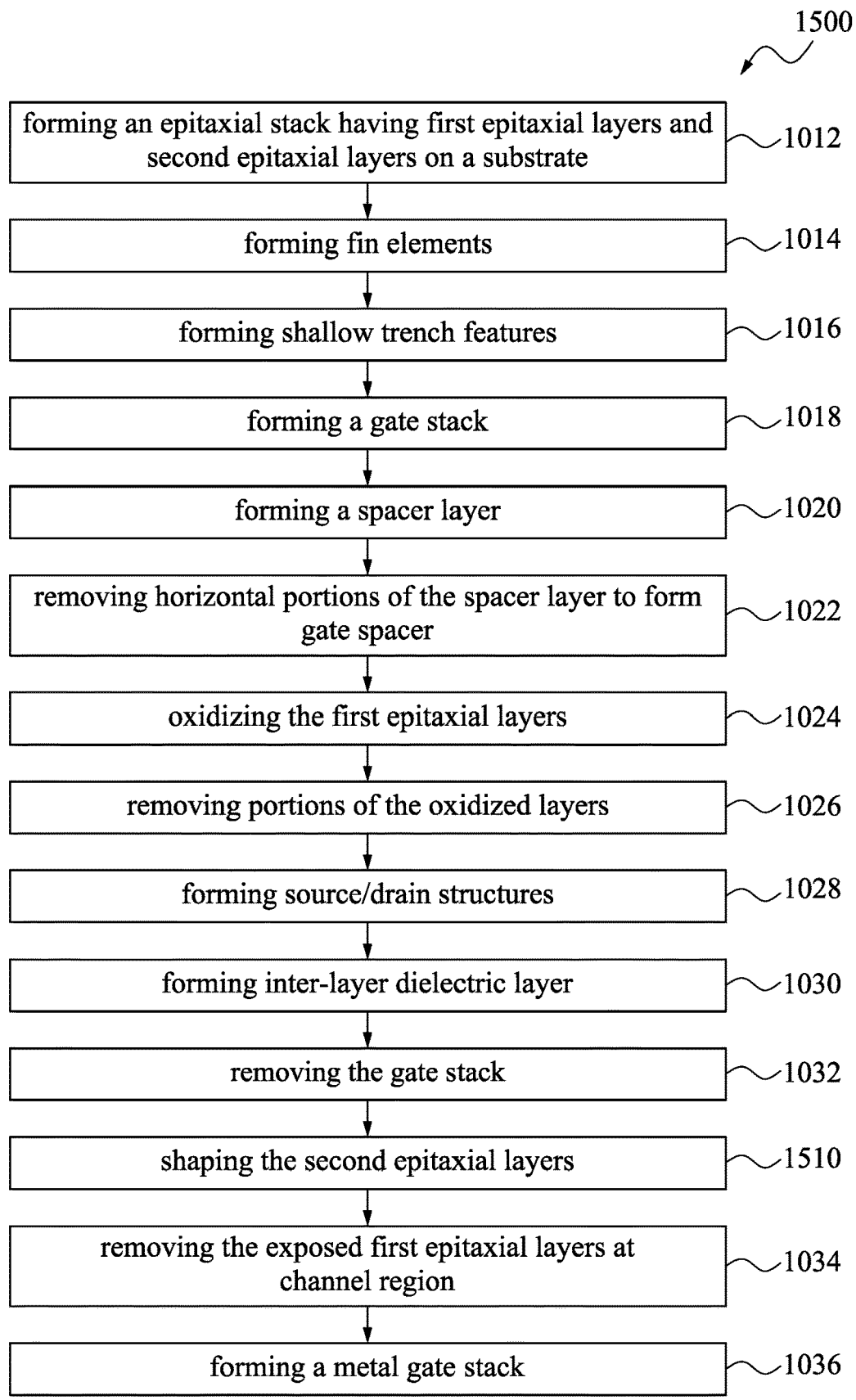
FIG. 15 is a method for manufacturing a semiconductor device in accordance with some embodiments of the present disclosure.

Illustrated in FIG. 15 is a method 1500 for manufacturing a semiconductor device in accordance with some embodiments of the present disclosure. Method 1500 differs from method 1000 in that method 1500 further includes, after operation 1032 and prior to operation 1034, an operation 1510. Since operations 1012 to 1036 of method 1500 are similar to those described above with respect to operations 1012 to 1036 of method 1000, a detailed description thereof is omitted herein for the sake of brevity.

Figure 16B:
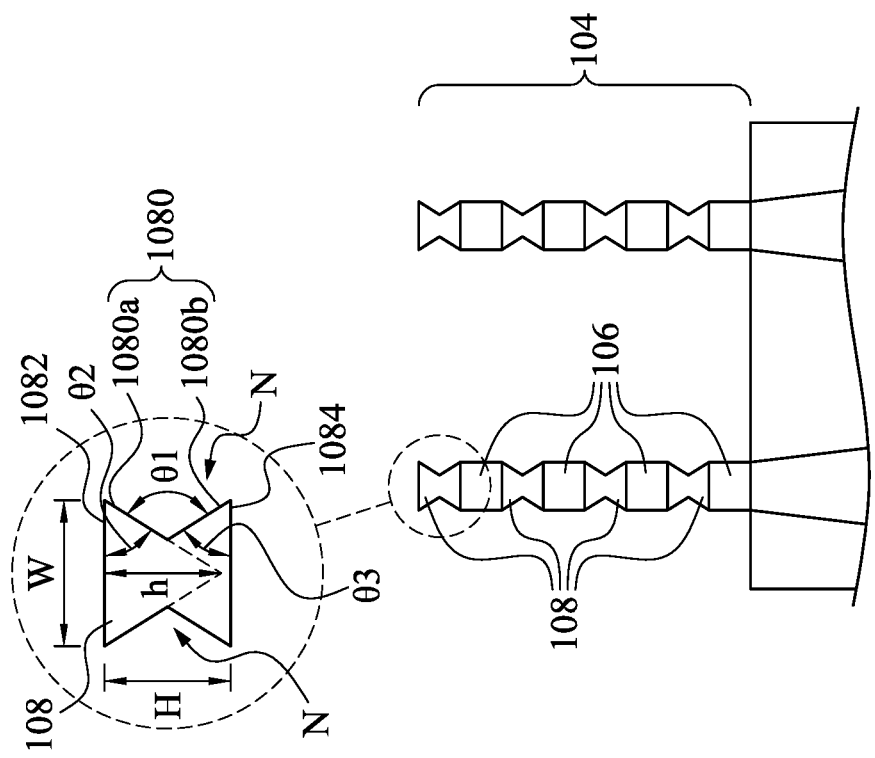
FIGS. 16A to 16C illustrate a semiconductor device at various stages of manufacturing in accordance with some embodiments of the present disclosure.
Figure 16A:
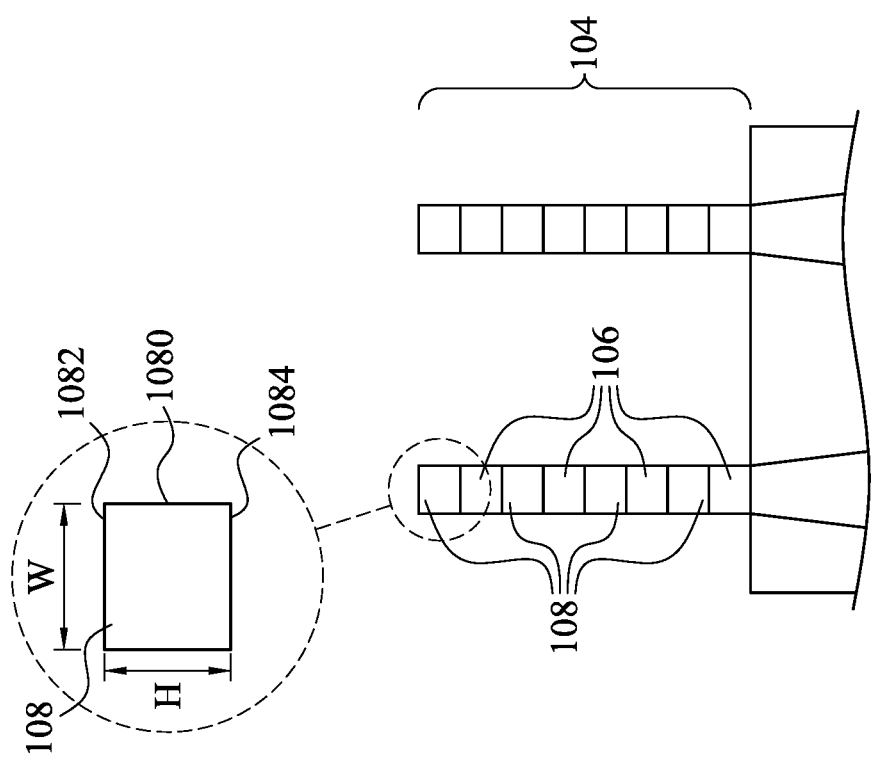

FIG. 16A is a cross-sectional view taken along line C-C of FIG. 12A. After operation 1032, i.e., after the epitaxial layers 106, 108 are exposed by the removal of the gate stack 118, with reference to FIG. 16A, at least one of top surface 1082 and bottom surface 1084 of the second epitaxial layers 108 may have a crystalline surface of (100) and at least one of sidewalls 1080 of the second epitaxial process 108 may have a crystalline surface of (110).

The method 1500 then proceeds to operation 1510 where the second epitaxial layers 108 in the channel region are shaped. With reference to FIG. 16B, a selective etching process, wet or dry or a combination thereof, is performed. The selective etching process shapes the second epitaxial layers 108 in the channel region to form notches N therein and creates first and second facets 1080a, 1080b that define the notch N in a sidewall 1080 of a second epitaxial layer 108. At least one of the first and second facets 1080a, 1080b has a (111) crystalline orientation. In some embodiments, the second epitaxial layers 108 are shaped using an etchant that includes, e.g., tetramethyl ammonium hydroxide (THAM), ammonium hydroxide ($NH_4OH$), or other suitable etchants.

In some embodiments, the epitaxial stack 104 (e.g. the epitaxial layers 106 and 108) is formed on a substrate (e.g. the substrate 102 described in FIGS. 1 to 14D) having (001) crystalline orientation, and as the shaping process is performed and as the (111) crystalline facets/surfaces 1080a, 1080b are created, the (111) crystalline surfaces 1080a, 1080b become resistant to the etchant of the shaping process. As a result, the shaping process stops when the (111) crystalline surfaces 1080a, 1080b of the notched sidewalls 1080 of the epitaxial layers 108 are exposed. The (111) crystalline surfaces 1080a, 1080b have good interface qualities, achieving a higher switch speed and a larger on current ($I_{on}$) for the semiconductor device.

In some embodiments, the first facet 1080a and the second facet 1080b define an angle θ1 therebetween. The first facet 1080a of the notched sidewall 1080 and the top surface 1082 of the second epitaxial layer 108 define an angle θ2 therebetween. The second facet 1080b of the notched sidewall 1080 and the bottom surface 1084 of the second epitaxial layers 108 define an angle θ3 therebetween.

In some embodiments, the angles θ2 and θ3 are substantially equal to each other. In some embodiments, at least one of the angles θ2 and θ3 is in a range from about 50° to about 60°. For example, at least one of the angles θ2 and θ3 is substantially equal to 54.7°. In some embodiments, the angle θ1 is greater than the angles θ2 and θ3. In some embodiments, the angle θ1 is in a range from about 100° to about 120°. In some embodiments, the angle θ1 is substantially twice the angles θ2 and θ3. In other embodiments, the angle θ1 is greater than about 100°. In an embodiment, the angle θ1 is substantially equal to about 110°. For example, the angle θ1 is substantially equal to about 109.4°. It is noted that when the substrate (e.g., the substrate 102) has (001) crystallization orientation, the angles θ2 and θ3 that is in a range from about 50° to about 60° can be determined as a (111) crystallization orientation and can also be determined as undergoing the disclosed shaping process, because there is no other crystalline plane that has an angle within this range. On the other hand, if an angle is far beyond this range, the sidewall (e.g., the sidewall 1080) cannot be regarded as having (111) crystallization orientation.

At least one of the notched epitaxial layers 108 has a substantially hour-glass shaped. For example, the epitaxial layer 108 has two opposite notched sidewalls 1080. Each of the notched sidewalls 1080 of the epitaxial layer 108 includes the first and second (111) crystalline facets 1080a, 1080b (only the facets 1080a, 1080b of one of the notched sidewalls 1080 is labeled in FIG. 16B). Further, the notched epitaxial layer 108 has a height (H) and width (W).

In some embodiments, when the facets 1080a of the opposite sidewalls 1080 of the epitaxial layer 108 are connected to form a triangle (drawn in dash-line), the triangle has a height (h) less than the epitaxial layer 108 height (H). For example, the triangle height (h) is substantially equal to (W/2)*tan θ3.

It is noted that, when the height (H) of the epitaxial layer 108 is less than twice the height (h) of the triangle, i.e., H<2*(W/2)*tan θ3, the shaping process may not laterally etch through the epitaxial layer 108, such that the epitaxial layer 108 includes top and bottom portions connected to each other, resulting in the hour-glass shape. Stated another way, the top and bottom portions of the epitaxial layer 108 taper in opposite directions.

Figure 16C:
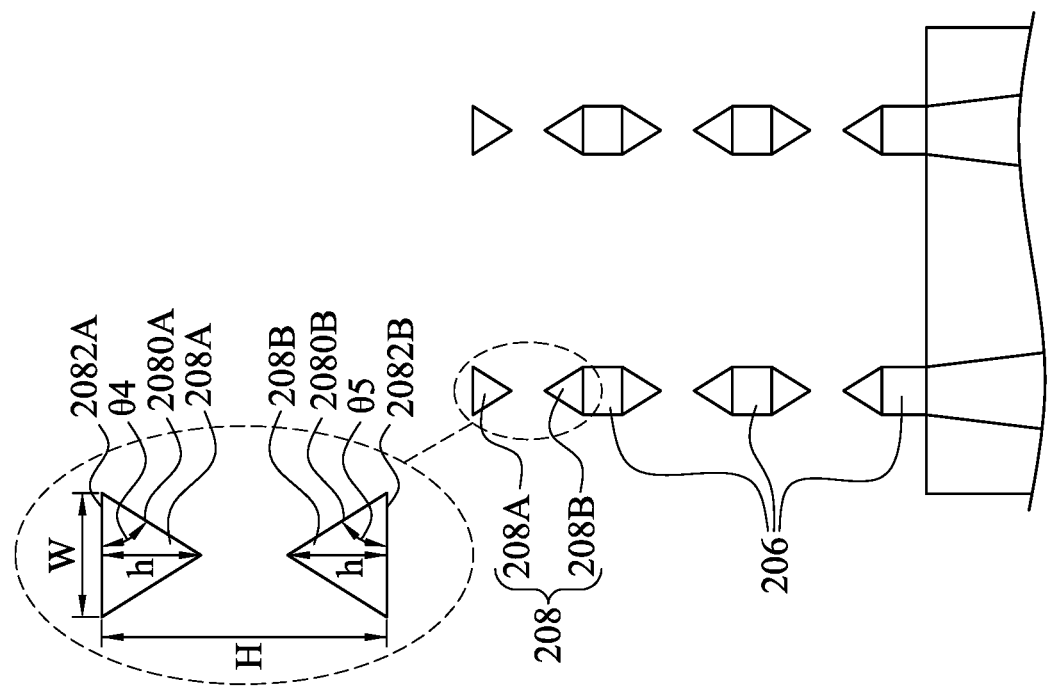

On the other hand, in an alternative embodiment, when the epitaxial layer 108 height (H) is greater than twice the height (h) of the triangle, i.e., H>2*(W/2)*tan θ3, the shaping process may divide the epitaxial layer 108 into spaced apart top and bottom portions 208A and 208B, as illustrated in FIG. 16C. The top and bottom portions 208A and 208B of the epitaxial layer 208 taper in opposite directions.

In such some embodiments, each of the top and bottom portions 208A, 208B has a triangular cross-section. The portions 208A and 208B may also be referred to as nanowires. The top portion 208A includes opposite sidewalls (only one of the sidewalls is labeled as 2080A in FIG. 16C), each of which has a (111) crystalline surface, and a top surface 2082A having a (001) crystalline surface. In some embodiments, the opposite sidewalls 2080A have lengths equal to each other and less than or greater than the top surface 208A. The sidewall 2080A and the top surface 2082A define an angle θ4 therebetween. Similarly, the bottom portion 208B includes opposite sidewalls 2080B (only one of the sidewalls is labeled as 2080B in FIG. 16C), each of which has a (111) crystalline surface, and a bottom surface 2082B having a (001) crystalline surface. In some embodiments, the opposite sidewalls 2080B have lengths equal to each other and less than or greater than the top surface. The sidewall 2080B and the bottom surface 2082B define an angle θ5 therebetween.

In some embodiments, the angles θ4 and θ5 are substantially equal to each other. In some embodiments, at least one of the angles θ4 and θ5 is in a range from about 50° to about 60°. For example, at least one of the angles θ4 and θ5 is equal to about 54.7°. In some embodiments, the height (h) of the upper portion 208A is substantially equal to about 0.596 W to about 0.866 W (e.g., about (W/2)*tan 50° to about (W/2)*tan 60°). That is, the height (h) of the upper portion 208A is lower than a width (W) of the upper portion 208A. Similar structure can be seen at the lower portion 208B, and detail descriptions are omitted for simplicity.

Figure 17:
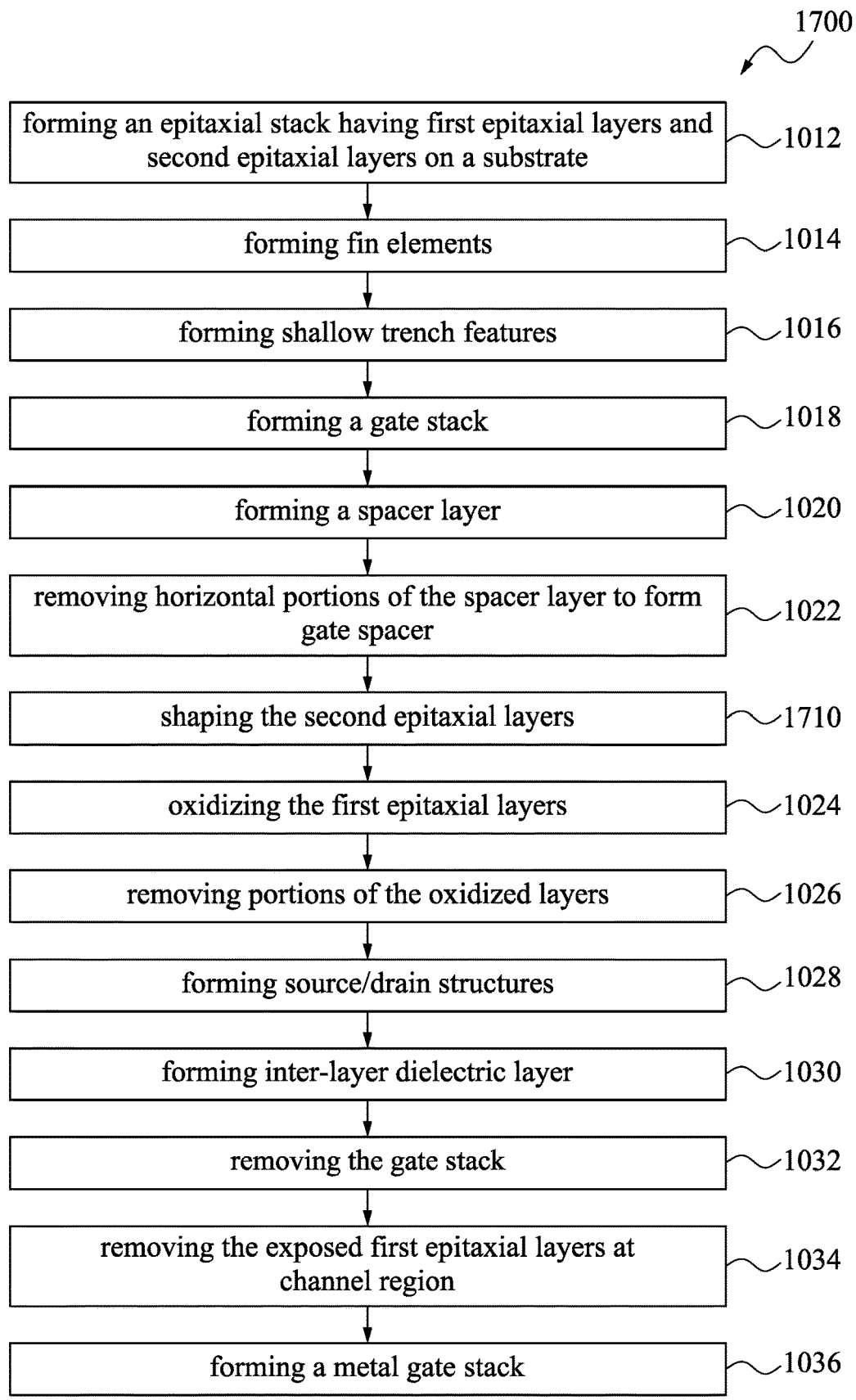
FIG. 17 is a method for manufacturing a semiconductor device in accordance with some embodiments of the present disclosure.

Illustrated in FIG. 17 is a method 1700 for manufacturing a semiconductor device in accordance with some embodiments of the present disclosure. Method 1700 differs from method 1000 in that method 1700 further includes, after operation 1022 and prior to operation 1024, an operation 1710. Since operations 1012 to 1036 of method 1700 are similar to those described above with respect to operations 1012 to 1036 of method 1000, a detailed description thereof is omitted herein for the sake of brevity.

Figure 18B:
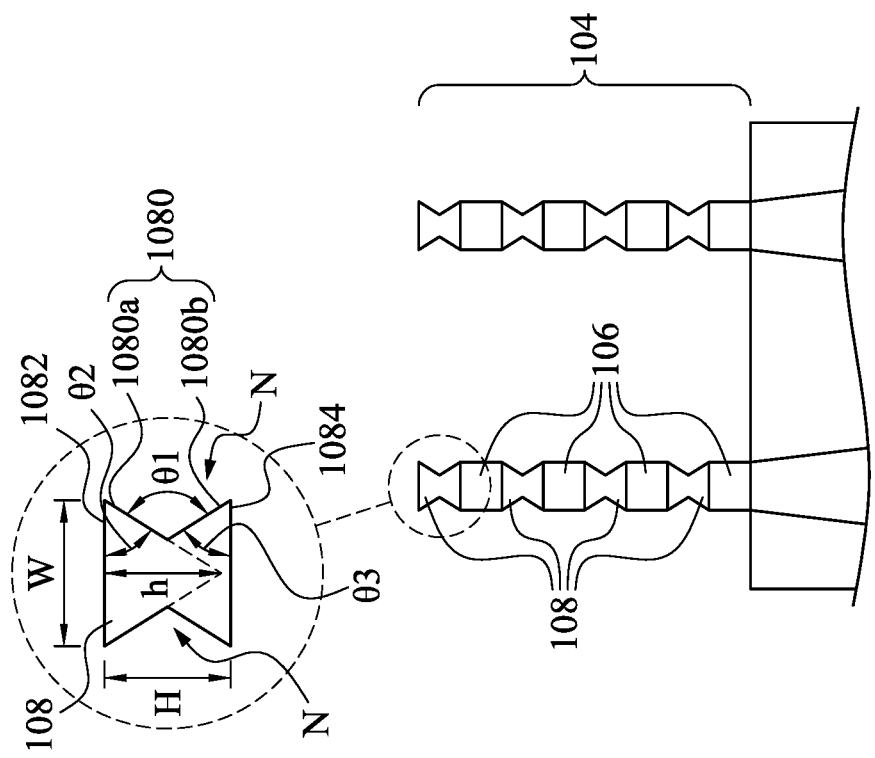
FIGS. 18A to 18C illustrate a semiconductor device at various stages of manufacturing in accordance with some embodiments of the present disclosure.
Figure 18A:
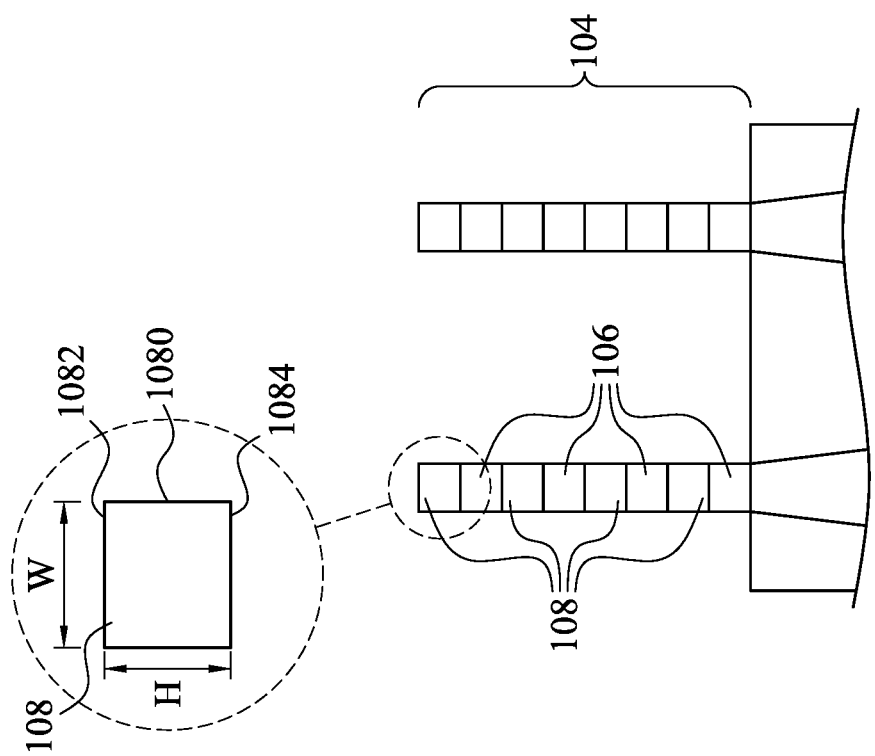

FIG. 18A is the cross-sectional view taken along line A-A of FIG. 7. After operation 1022, i.e., after the gate spacers are formed by the removal of the portions of the spacer layer, with reference to FIG. 18A, at least one of top surface 1082 and bottom surface 1084 of the second epitaxial layers 108 may have a crystalline surface of (001) and at least one of sidewalls 1080 of the second epitaxial process 108 may have a crystalline surface of (110).

The method 1700 then proceeds to operation 1710 where the second epitaxial layers 108 in the source/drain regions are shaped. With reference to FIG. 18B, a selective etching process, wet or dry or a combination thereof, is performed. The selective etching process shapes the second epitaxial layers 108 in the source/drain regions to form notches N therein and creates first and second facets 1080a, 1080b that define the notch N in a sidewall 1080 of a second epitaxial layer 108. At least one of the first and second facets 1080a, 1080b has a (111) crystalline orientation. In some embodiments, the second epitaxial layers 108 are shaped using an etchant that includes, e.g., tetramethyl ammonium hydroxide (THAM), ammonium hydroxide (NH₄OH), or other suitable etchants.

It is noted that as the shaping process is performed and as the (111) crystalline facets/surfaces 1080a, 1080b are created, the (111) crystalline surfaces 1080a, 1080b become resistant to the etchant of the shaping process. As a result, the shaping process stops when the (111) crystalline surfaces 1080a, 1080b of the notched sidewalls 1080 of the epitaxial layers 108 are exposed. The (111) crystalline surfaces 1080a, 1080b have good interface qualities, achieving a higher switch speed and a larger on current ($I_{on}$) for the semiconductor device.

In some embodiments, when the facets 1080a of the opposite sidewalls 1080 of the epitaxial layer 108 are connected to form a triangle (drawn in dash-line), the triangle has a height (h) less than the epitaxial layer 108 height (H). For example, the triangle height (h) is substantially equal to (W/2)*tan θ3.

It is noted that, when the height (H) of the epitaxial layer 108 is less than twice the height (h) of the triangle, i.e., H<2*(W/2)*tan θ3, the shaping process may not laterally etch through the epitaxial layer 108 such that the epitaxial layer 108 includes top and bottom portions connected to each other, resulting in the hour-glass shaped for the epitaxial layer 108, as illustrated in FIG. 18B. Since the structures of the notched epitaxial layer 108 in the source/drain region of FIG. 18B is similar to those described above with respect to the epitaxial layer 108 in the channel region of FIG. 16B, a detailed description thereof is omitted herein for the sake of brevity.

Figure 18C:
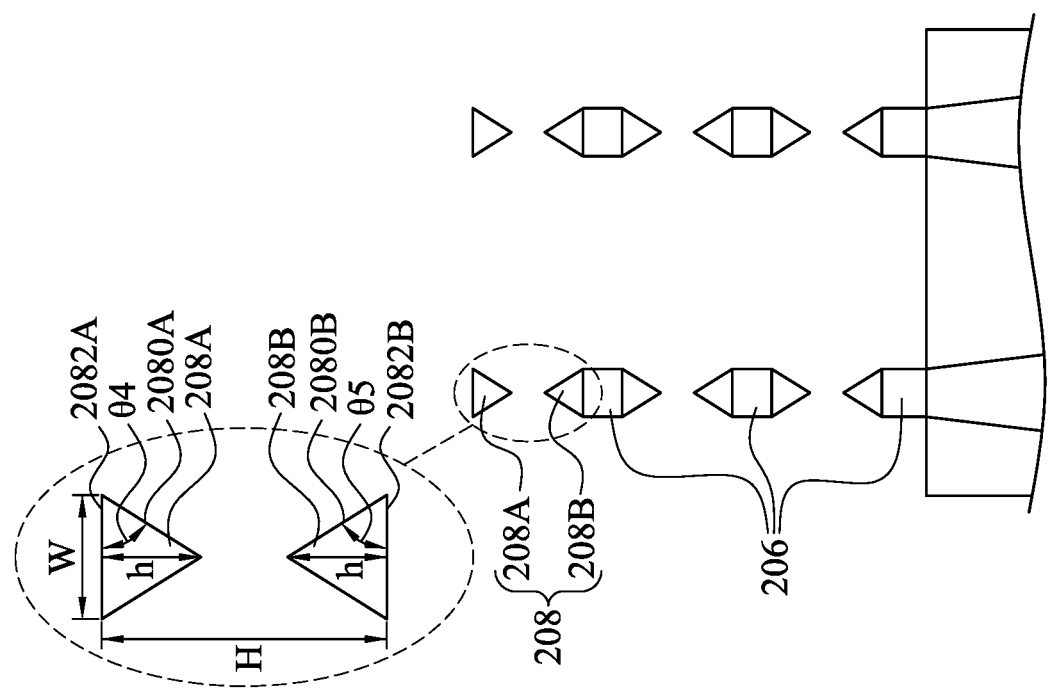

On the other hand, in an alternative embodiment, when the epitaxial layer 108 height (H) is greater than twice the height (h) of the triangle, i.e., H>2*(W/2)*tan θ3, the shaping process may divide the epitaxial layer 108 into spaced apart top and bottom portions, as illustrated in FIG. 16C. Since the structures of the epitaxial layer 108 in the source/drain region of FIG. 18C is similar to those described above with respect to the epitaxial layer 108 in the channel region of FIG. 16C, a detailed description thereof is omitted herein for the sake of brevity.

Figure 19:
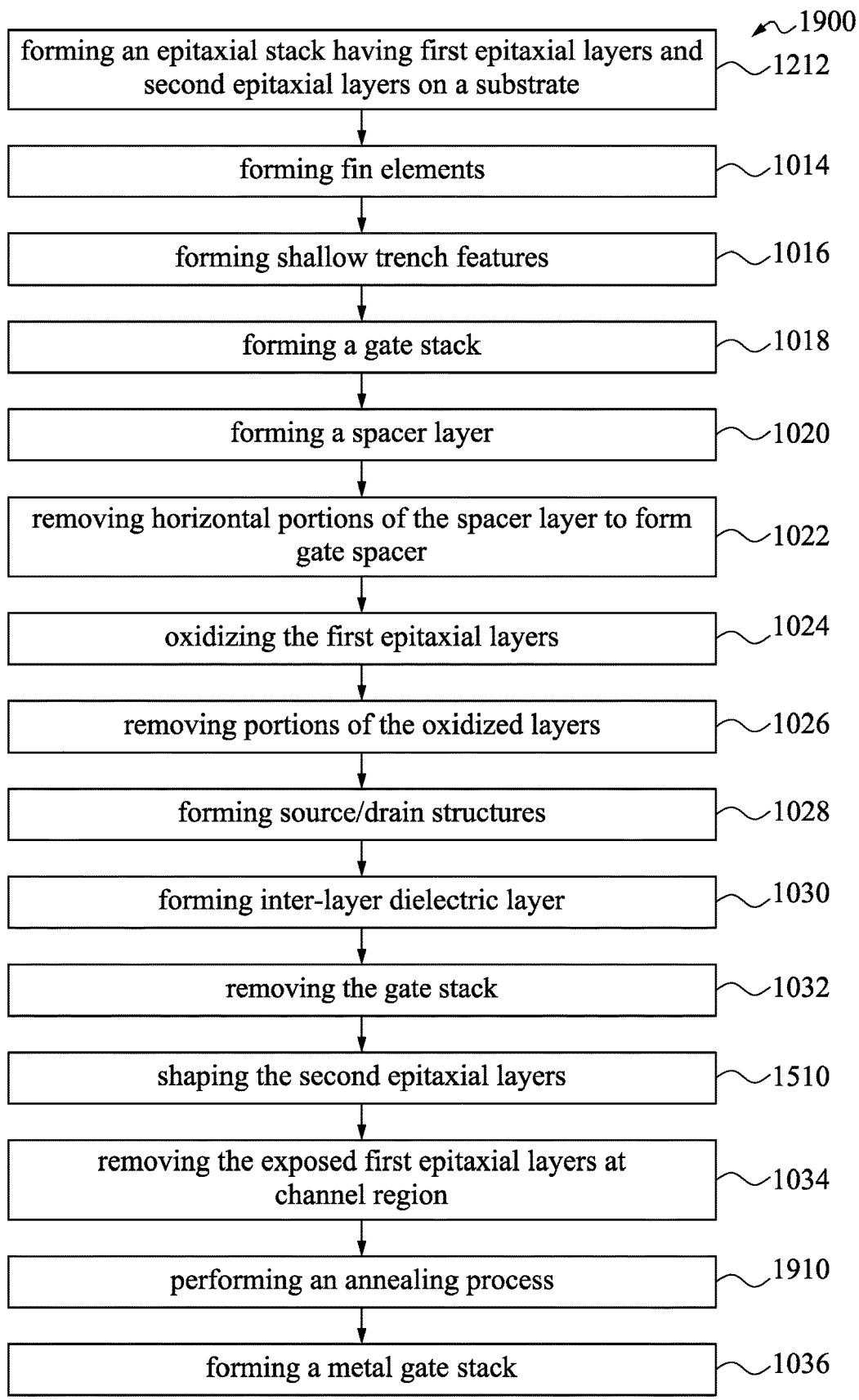
FIG. 19 is a method for manufacturing a semiconductor device in accordance with some embodiments of the present disclosure.

Illustrated in FIG. 19 is a method 1900 for manufacturing a semiconductor device in accordance with some embodiments of the present disclosure. Method 1900 differs from method 1500 in that method 1900 further includes, after operation 1034 and prior to operation 1036, an operation 1910. Since operations 1012 to 1036 and 1510 of method 1900 are similar to those described above, a detailed description thereof is omitted herein for the sake of brevity.

Figure 20B:
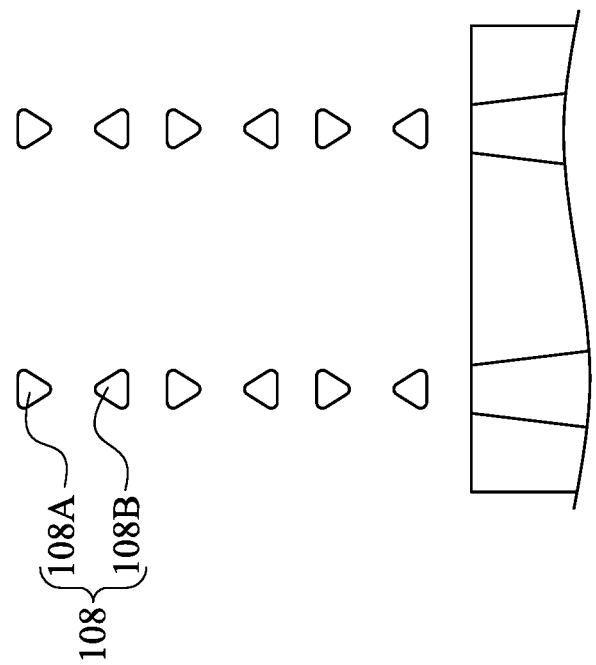
FIGS. 20A and 20B illustrate a semiconductor device at various stages of manufacturing in accordance with some embodiments of the present disclosure.
Figure 20A:
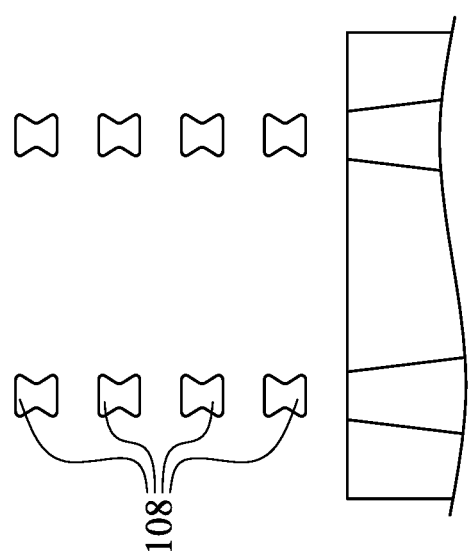

FIG. 20A is a cross-sectional view of the epitaxial layers 108 in the channel region where corners of the epitaxial layer 108 are rounded. In some embodiments, after operation 1510, i.e., wherein the epitaxial layers 108 in the channel region are shaped such that top and bottom portions of the epitaxial layers 108 are connected to each other, and after operation 1034, wherein the first epitaxial layers 106 (see FIG. 16B) in the channel region are removed, with reference to FIG. 20A, the method 1900 then proceeds to operation 1910 where an annealing process is performed. The annealing process rounds the corners of the epitaxial layers 108 in the channel region, reducing leakage and increasing efficiency of the semiconductor device.

FIG. 20B is a cross-sectional view of the epitaxial layers 108 in the channel region where corners of the epitaxial layer 108 are rounded. In some embodiments, after operation 1510, i.e., wherein the epitaxial layers 108 in the channel region are shaped such that top and bottom portions of the epitaxial layers 108 are spaced apart from each other, and after operation 1034, where the first epitaxial layers 106 in the channel region are removed, with reference to FIG. 20B, the method 1900 then proceeds to operation 1910 where an annealing process is performed The annealing process rounds the corners of the epitaxial layers 108 in the channel region, reducing leakage and increasing efficiency of the semiconductor device.

By way of example, the annealing process may be performed at a temperature around 400° C. The anneal time may range from about 10 second to about 5 minute. The pressure in the reaction chamber (not shown) used for the annealing process may vary, depending in part upon the environment within the reaction chamber. The reaction chamber may be a CVD epitaxial reactor, for example. The annealing process may occur in a reaction chamber having an environment of hydrogen gas ($H_2$) at a partial pressure ranging from about 10 torr to about 100 torr. The annealing environment may also be one of the following environments (but not limited to): an environment of a mixed gas including hydrogen and argon; an environment of a mixed gas including hydrogen and nitrogen; an environment with other gases in addition to hydrogen to form a mixed gas ambient; or an environment of an inert gas, for example.

Figure 21B:
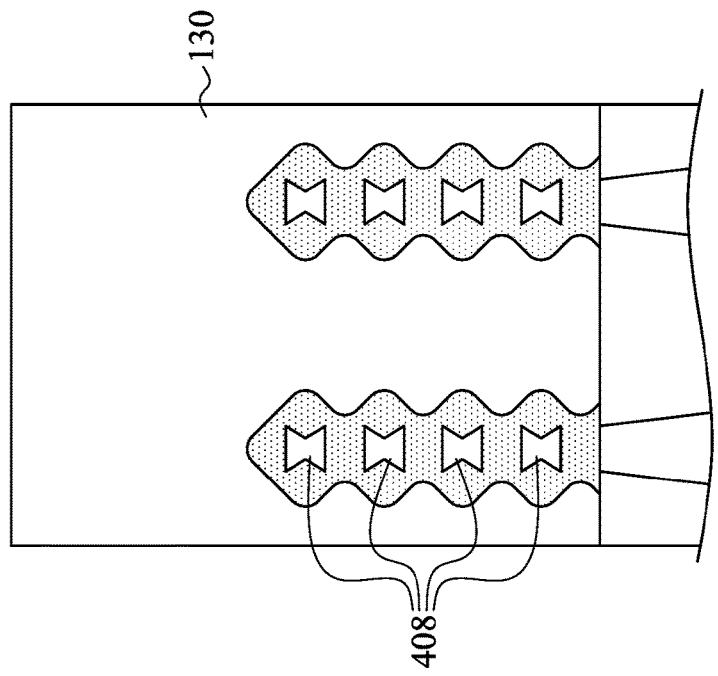
FIGS. 21A to 21D illustrate a semiconductor device at various stages of manufacturing in accordance with some embodiments of the present disclosure.
Figure 21A:
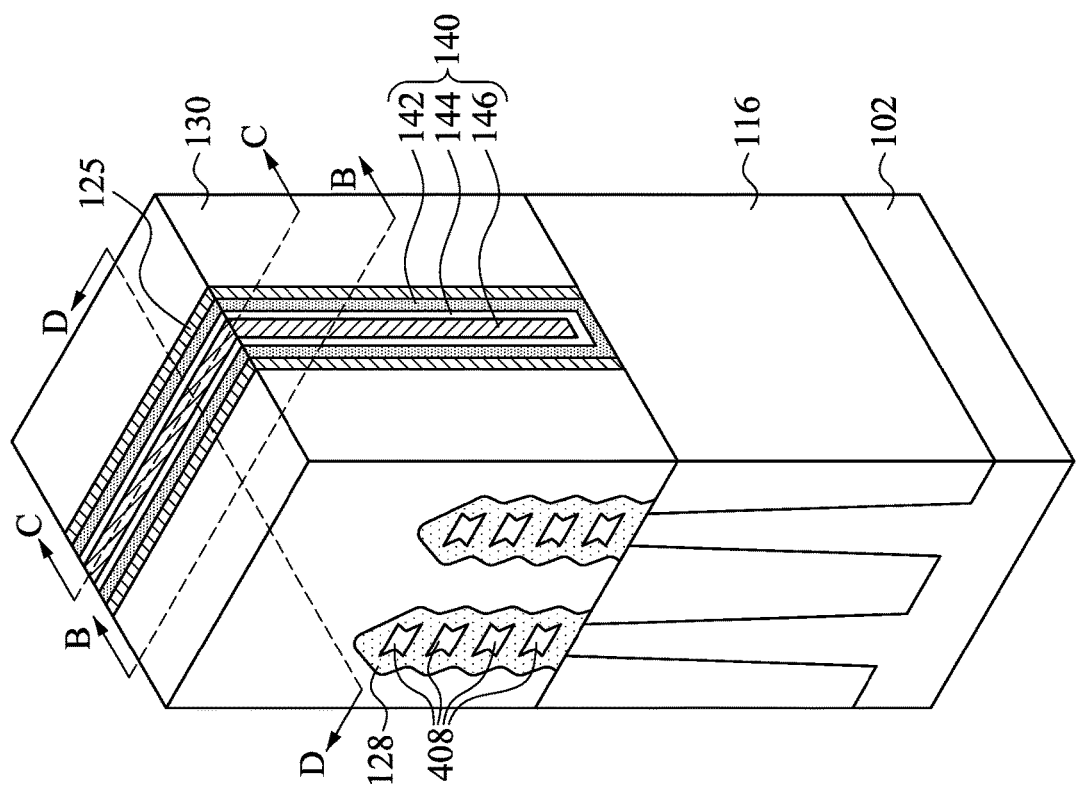
Figure 21D:
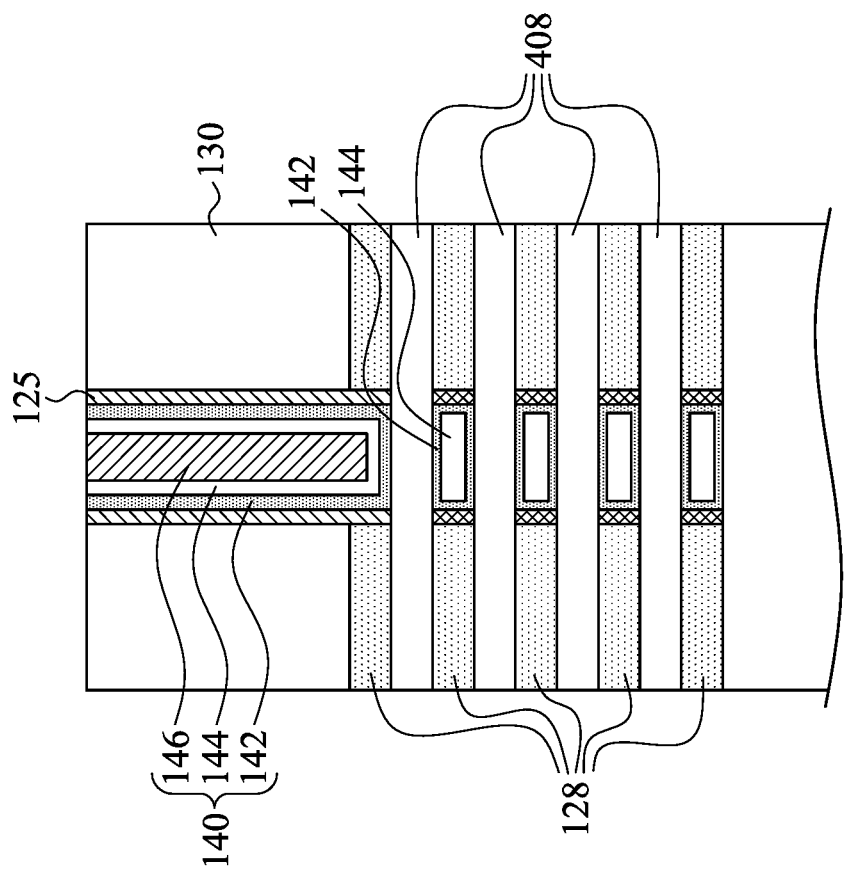
Figure 21C:
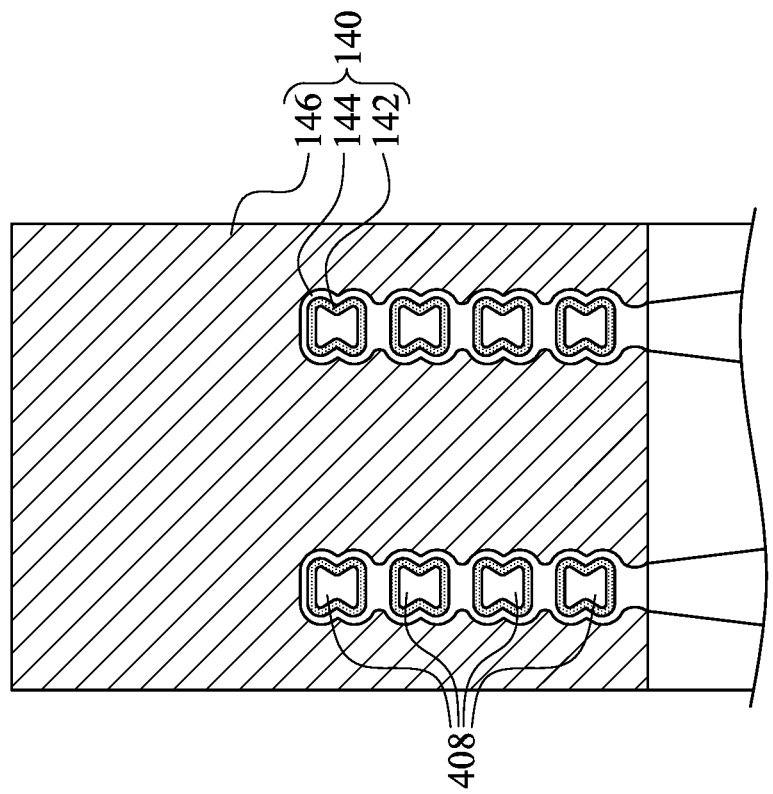

FIGS. 21A to 21D illustrate a semiconductor device according to some embodiments of the present disclosure, in which FIGS. 21B, 21C, and 21D are cross-sectional view along lines B-B, C-C, and D-D of FIG. 21 A, respectively. As shown in FIGS. 21A to 21D, the semiconductor device includes a plurality of nanowires 408. The nanowires 408 in source/drain region, as best shown in FIG. 21B, are hourglass-shaped nanowires 408. The nanowires 408 in source/drain region may include notched sidewalls, sidewalls 1080, that have (111) crystalline oriented facets, such as facets 1080a, 1080b. Further, the nanowires 408 in channel region, as best shown in FIG. 21C, may include notched sidewalls, e.g., sidewalls 1080, that have (111) crystalline oriented facets, e.g., facets 1080a, 1080b and that include rounded corners in FIG. 20A. In some embodiments, the corners of the nanowires 408 in source/drain region are sharper than the corners of the nanowires 408 in channel region. This is because the nanowires 408 in the source/drain region did not undergo an annealing process, e.g., operation 1910.

In some other embodiments, the nanowires 408 in the source/drain region may not be shaped, such as by operation 1710. As such, the nanowires 408 in the source/drain region may have a rectangular cross section such that the nanowires 408 in the source/drain region have opposite sidewalls that are (110) crystalline orientated sidewalls.

Figure 22B:
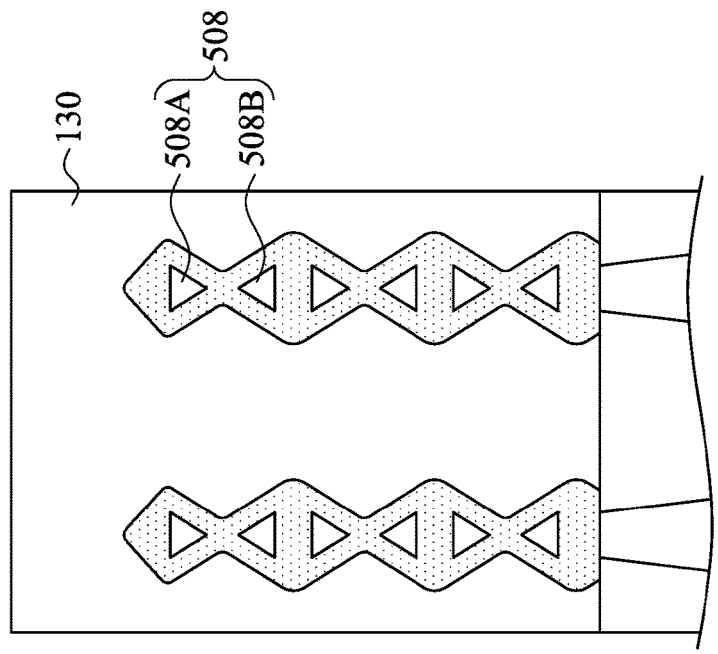
FIGS. 22A to 22D illustrate a semiconductor device at various stages of manufacturing in accordance with some embodiments of the present disclosure.
Figure 22A:
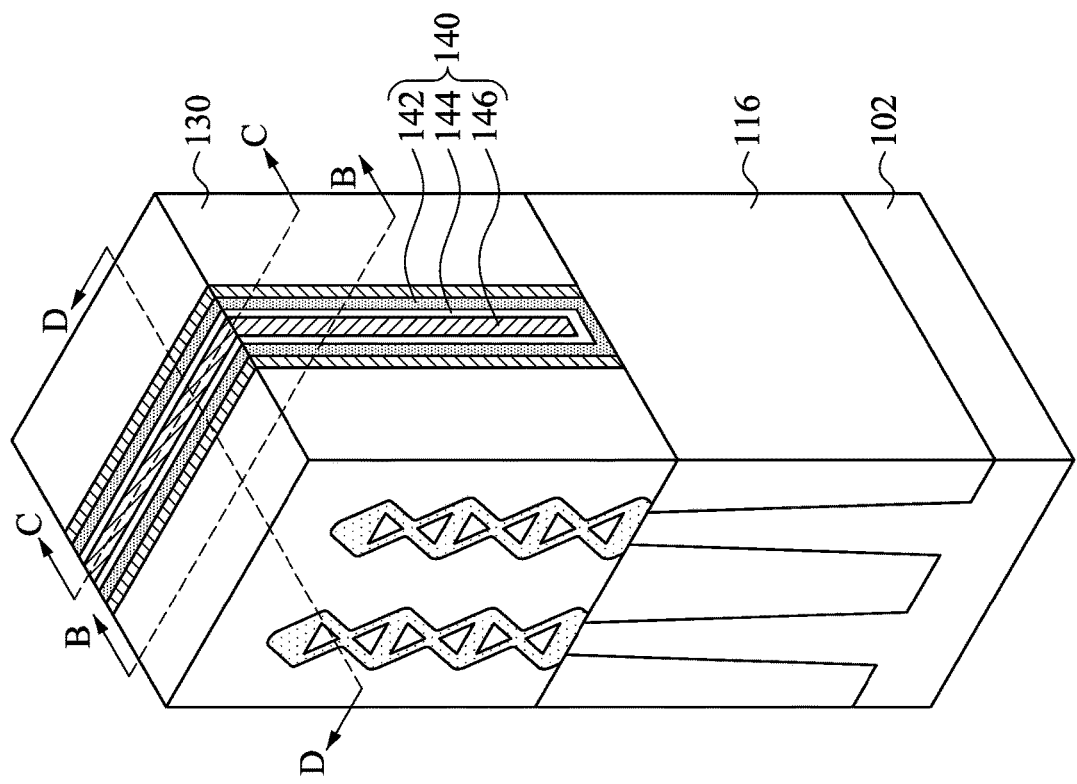
Figure 22D:
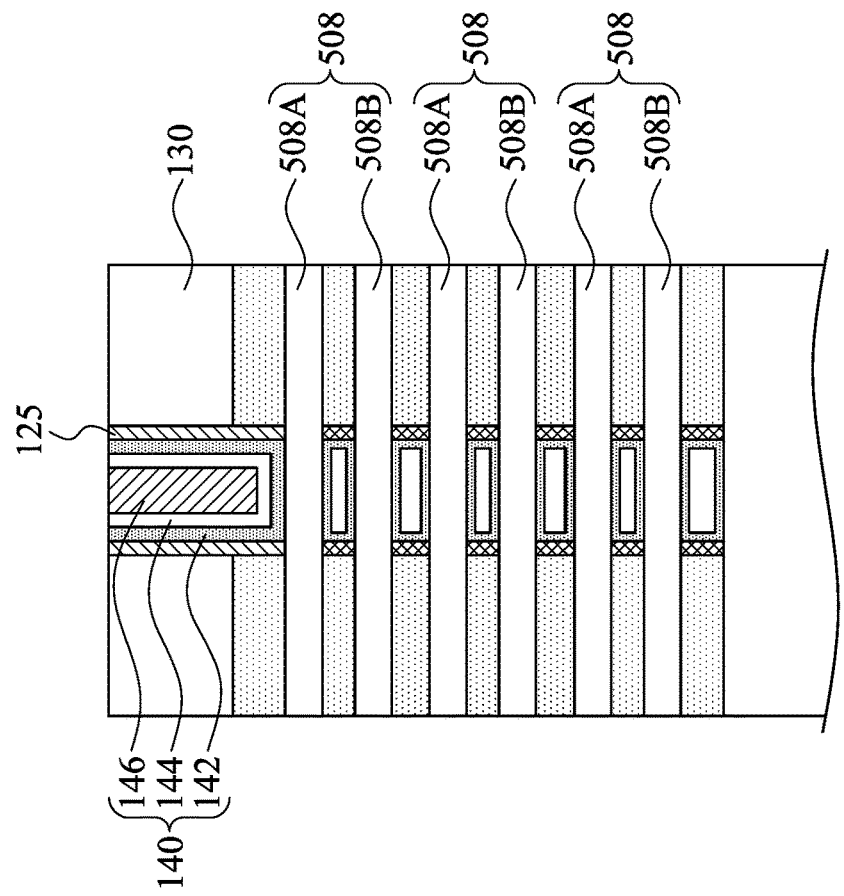
Figure 22C:
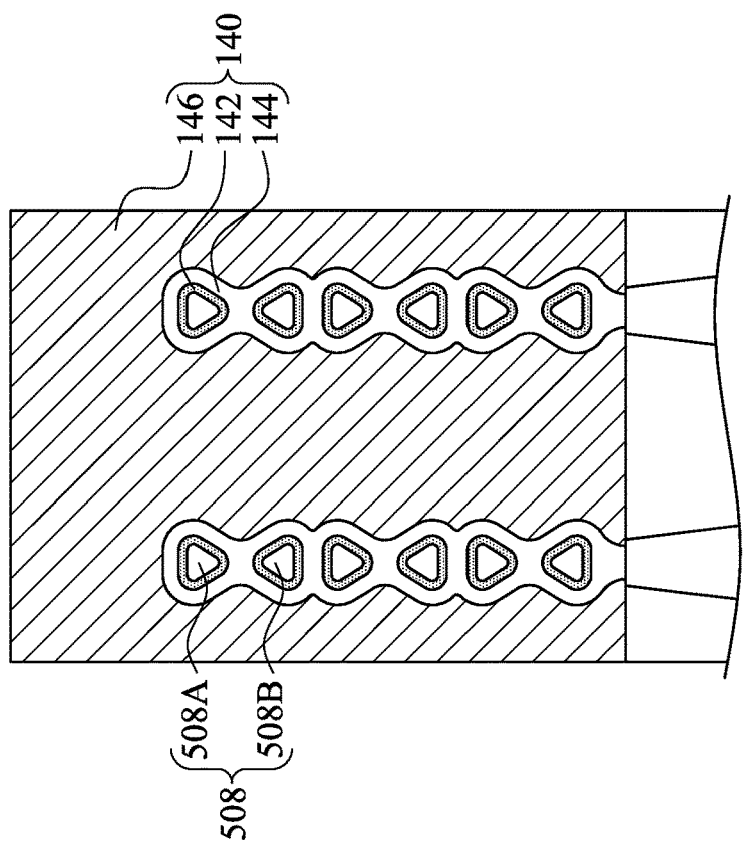

FIGS. 22A to 22D illustrate a semiconductor device according to some embodiments of the present disclosure, in which FIGS. 22B, 22C, and 22D are cross-sectional view along lines B-B, C-C, and D-D of FIG. 22A, respectively. The semiconductor device includes a plurality of nanowires 508. The nanowires 508 in the source/drain region (e.g., FIG. 22B) are shaped, e.g., by operation 1710, such that the nanowires 508 include spaced apart top and bottom portions, e.g., top and bottom portions 508A, 508B. The nanowires 508 in the channel region, as best shown in FIG. 22C, are shaped, such as by operation 1510, and undergo an annealing process, e.g., operation 1910, and have rounded corners. The nanowires 508 in the source/drain region (e.g., FIG. 22B) may include a top portion 508A and a bottom portion 508B both having sidewalls of (111) crystalline orientation. Further, the nanowires 508 in channel region (e.g., FIG. 22C) may include a top portion 508A and a bottom portion 508B both having sidewalls of (111) crystalline orientation and include rounded corners. In some embodiments, the top portion 508A and the bottom portion 508B may be referred to as nanowires 508A and 508B.

Figure 23B:
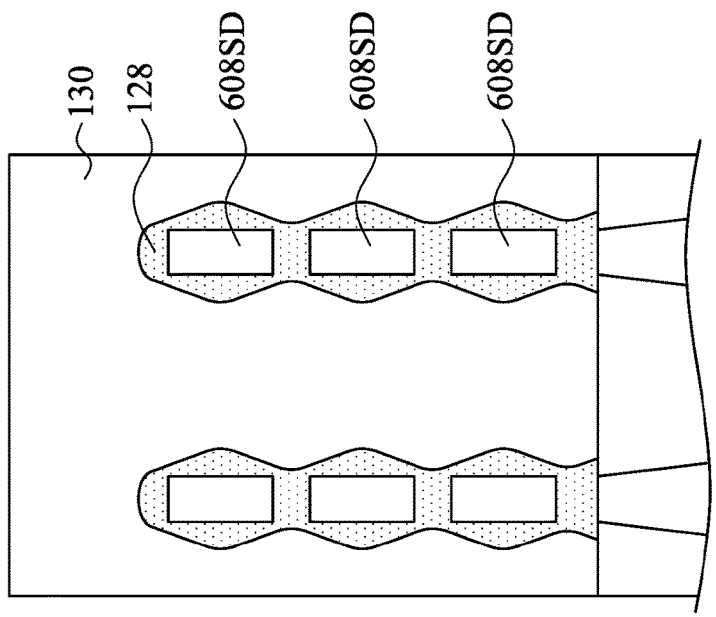
FIGS. 23A to 23D illustrate a semiconductor device at various stages of manufacturing in accordance with some embodiments of the present disclosure.
Figure 23A:
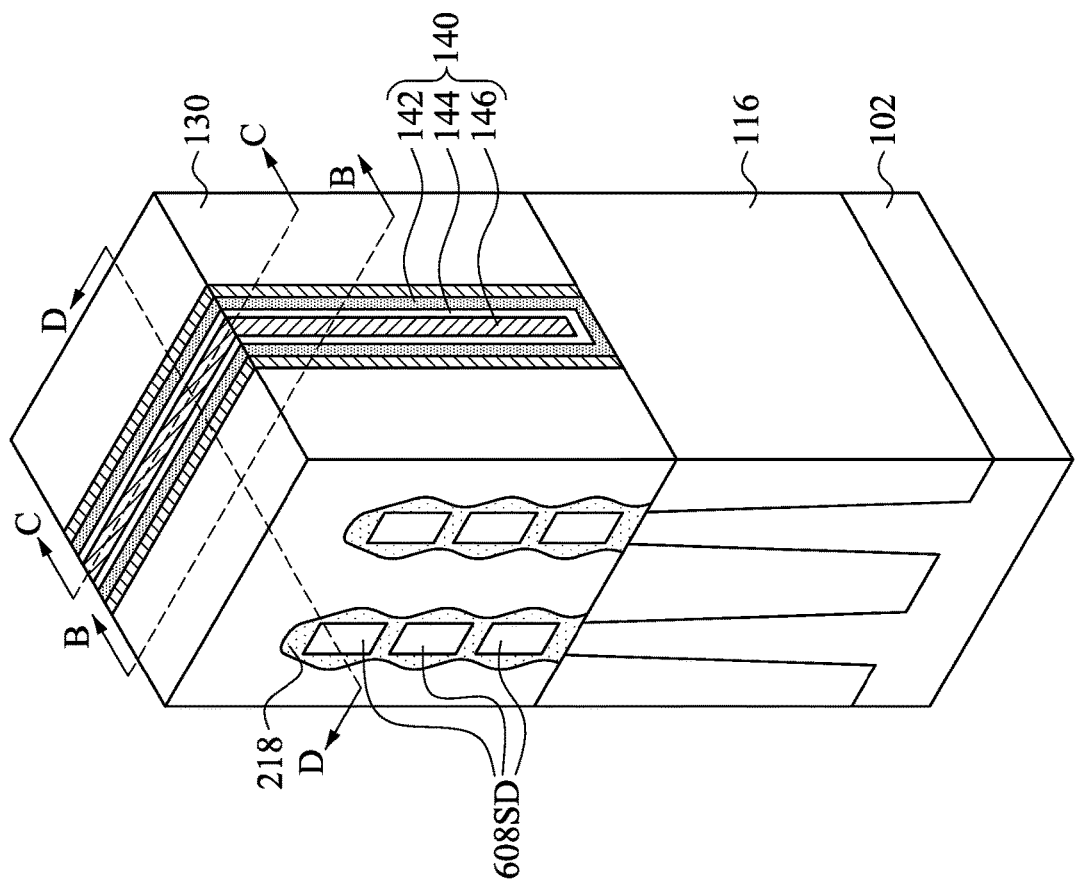
Figures 23C, 23D:
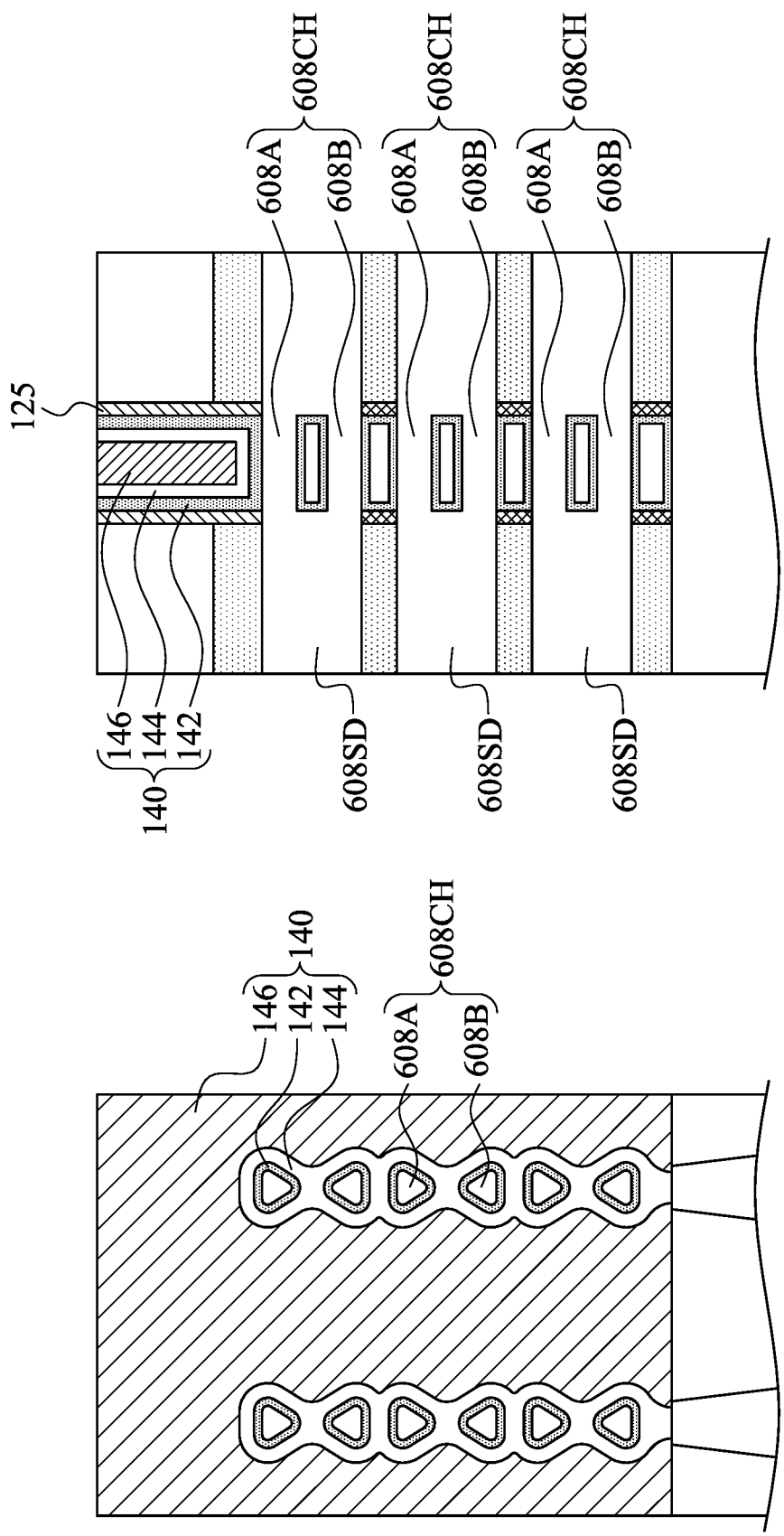

FIGS. 23A to 23D illustrate a semiconductor device according to some embodiments of the present disclosure, in which FIGS. 23B, 23C, and 23D are cross-sectional view along lines B-B, C-C, and D-D of FIG. 23A, respectively. Many aspects of FIGS. 23A to 23D are similar to FIGS. 22A to 22D. Different from FIGS. 22A to 22D, in FIGS. 23A to 23D, the nanowires 608SD in source/drain region (FIG. 23B) does not undergo the shaping process, such that the nanowires 608SD substantially maintain their original shapes (e.g., a rectangular shape). Stated another way, the nanowires 608SD have top and bottom portions that are connected, i.e., not divided into two pieces, to each other, e.g., nanowires 508 in FIG. 22B. Thus, as shown in FIGS. 23A to 23D, the number of the nanowires 608A and 608B in channel region is twice the number of the nanowires 608SD in source/drain region. As shown in FIG. 23D, one of the nanowires 608SD in source/drain region is substantially aligned with one nanowire 608A and one nanowire 608B. Stated another way, one nanowire 608SD is substantially corresponds to two adjacent nanowires 608A and 608B.

According to the aforementioned embodiments, it can be seen that the present disclosure offers advantages over GAA devices. It is understood, however, that other embodiments may offer additional advantages, and not all advantages are necessarily disclosed herein, and that no particular advantage is required for all embodiments. One advantage is that an etching process is performed to etch nanowires to create facets having (111) surface orientation, where the (111) surface has good interface quality that is well defined, and may achieve a higher switch speed and a larger on current of the device. Also, an annealing process is performed to rounded corners of nanowires in channel region, which in turn will reduce the cycling leakage and increasing the overall efficiency of the devices. As such, the transport properties of the device may be improved.

In some embodiments of the present disclosure, a semiconductor device includes a substrate, a plurality of nanowires, and a gate stack. The nanowires are over the substrate. Each of the nanowires includes a channel region, the channel region having top and bottom surfaces and a first sidewall between the top and bottom surfaces, in which the first sidewall of the channel region has a (111) crystalline orientation. The gate stack over the channel regions of the nanowires.

In some embodiments of the present disclosure, a semiconductor device includes a substrate, a plurality of nanowires, and a epitaxy structure. The nanowires are over the substrate. Each of the nanowires includes a source/drain region, the source/drain region having top and bottom surfaces and a first sidewall between the top and bottom surfaces, in which the first sidewall of the source/drain region has a (111) crystalline orientation. The epitaxy structure over the source/drain regions of the nanowires.

In some embodiments of the present disclosure, a method includes forming a nanowire over a substrate, the nanowire having a source/drain region and a channel region; etching the nanowire such that the nanowire has an hourglass shaped cross section; and forming a gate stack over the channel region of the nanowire.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   a fin element over the substrate;
   a plurality of first nanowires over the fin element, wherein each of the first nanowires includes a first channel region, the first channel region has a first sidewall, a second sidewall and a top surface connecting the first sidewall and the second sidewall, both the first sidewall and the second sidewall have (111) crystalline orientation, the first channel region has a first triangular cross-section, and three sides of the first triangular cross-section are formed from the first sidewall, the second sidewall and the top surface; and
   a gate stack over the first channel regions of the first nanowires, wherein the gate stack comprising a gate dielectric layer in contact with the three sides of the first triangular cross-section.

2. The semiconductor device of claim 1, wherein the first sidewall and top surface of the first channel region form a first angle therebetween, and the first angle is in a range from about 50° to about 60°.

3. The semiconductor device of claim 1, wherein the first sidewall and the second sidewall of the first channel region form an acute angle therebetween.

4. The semiconductor device of claim 1, further comprising:
   a plurality of second nanowires over the substrate, wherein the first nanowires and the second nanowires are alternatingly stacked, each of the second nanowires includes a second channel region, the second channel region has a third sidewall, a fourth sidewall and a bottom surface connecting the third sidewall and the fourth sidewall, both the third sidewall and the fourth sidewall have (111) crystalline orientation, the second channel region has a second triangular cross-section, and three sides of the second triangular cross-section are formed from the third sidewall, the fourth sidewall and the bottom surface, and the gate dielectric layer is in contact with the three sides of the second triangular cross-section.

5. The semiconductor device of claim 4, wherein the third sidewall and bottom surface of the second channel region form a second angle therebetween, and the second angle is in a range from about 50° to about 60°.

6. The semiconductor device of claim 4, wherein the third sidewall and the fourth sidewall of the second channel region form an acute angle therebetween.

7. A semiconductor device comprising:
   a substrate;
   a first nanowire over the substrate, wherein the first nanowire has a first sidewall having (111) crystalline orientation;
   a second nanowire between the first nanowire and the substrate, wherein the second nanowire has a second sidewall having (111) crystalline orientation;
   a gate stack wrapping around a channel region of the first nanowire and covering the first sidewall having the (111) crystalline orientation;
   an epitaxy structure wrapping around a source/drain region of the first nanowire and a source/drain region of the second nanowire and covering the first sidewall having the (111) crystalline orientation and covering the second sidewall having the (111) crystalline, wherein the epitaxy structure includes a first portion covering the first sidewall of the first nanowire and a second portion covering the second sidewall of the second nanowire and in contact with the first portion of the epitaxy structure; and
   an interlayer dielectric layer surrounding the epitaxy structure, wherein the interlayer dielectric layer includes a protruding portion vertically sandwiched between the first portion and the second portion of the epitaxy structure.

8. The semiconductor device of claim 7, further comprising:
   a fin element between the first nanowire and the substrate; and
   an isolation feature surrounding the fin element.

9. The semiconductor device of claim 7, wherein the epitaxy structure completely surrounds the first nanowire.

10. The semiconductor device of claim 7, further comprising:
an oxide layer between the first nanowire and the second nanowire and between the epitaxy structure and the gate stack.

11. The semiconductor device of claim 7, wherein the gate stack comprising:
a first gate dielectric layer wrapping around the first nanowire;
a second gate dielectric layer wrapping around the second nanowire; and
a work function metal layer between the first gate dielectric layer and the second gate dielectric layer.

12. The semiconductor device of claim 7, further comprising:
a third nanowire between the second nanowire and the substrate, wherein the third nanowire has a third sidewall having (111) crystalline orientation, the epitaxy structure wraps around a source/drain region of the third nanowire, the epitaxy structure includes a firs portion sandwiched between the first nanowire and the second nanowire and a second portion sandwiched between the second nanowire and the third nanowire, and a width of the second portion of the epitaxy structure is less than a width of the third portion of the epitaxy structure.

13. A semiconductor device comprising:
a substrate;
a first nanowire and a second nanowire between the first nanowire and the substrate, wherein both the first nanowire and the second nanowire have first sidewalls having (111) crystalline surface, wherein both the first nanowire and the second nanowire have second sidewalls having (111) crystalline surface and intersecting the first sidewall;
a first gate dielectric layer wrapping around the first nanowire;
a second gate dielectric layer wrapping around the second nanowire;
a work function metal layer formed over the first gate dielectric layer and the second gate dielectric layer and extending between the first nanowire and the second nanowire;
a source/drain structure wrapping around the first nanowire and the second nanowire;
a fin element between the second nanowire and the substrate; and
a gate electrode over the work function metal layer, wherein the gate electrode is in contact with an upper surface of the fin element.

14. The semiconductor device of claim 13, wherein the work function metal layer includes a first portion covering the first sidewall of the first nanowire and a second portion covering the first sidewall of the second nanowire, and the gate electrode includes a first protruding portion sandwiched between the first portion and the second portion of the work function metal layer.

15. The semiconductor device of claim 13, wherein the work function metal layer includes a third portion covering the second sidewall of the first nanowire and a fourth portion covering the second sidewall of the second nanowire, and the gate electrode includes a second protruding portion sandwiched between the third portion and the fourth portion of the work function metal layer.

16. The semiconductor device of claim 13, further comprising:
an isolation feature surrounding the fin element and covering sidewalls of the fin element.

17. The semiconductor device of claim 13, further comprising:
an oxide layer between the second nanowire and the fin element and between the source/drain structure and the work function metal layer.

18. The semiconductor device of claim 1, wherein the gate stack further comprises a work function layer over the gate dielectric layer and sandwiched between a bottommost one of the second nanowires and an upper surface of the substrate and a gate electrode over the work function layer and in contact with the upper surface of the substrate.

19. The semiconductor device of claim 13, wherein the fin element and the substrate are made of a continuous semiconductor material.

20. The semiconductor device of claim 13, wherein the first nanowire has a top surface and intersecting the first sidewall and the second sidewall of the first nanowire, and the second nanowire has a bottom surface and intersecting the first sidewall and the second sidewall of the second nanowire.

* * * * *